United States Patent
Tsuchi et al.

(10) Patent No.: US 7,474,138 B2
(45) Date of Patent: Jan. 6, 2009

(54) LEVEL SHIFT CIRCUIT AND DRIVER CIRCUIT USING THE SAME

(75) Inventors: Hiroshi Tsuchi, Tokyo (JP); Daigo Miyasaka, Tokyo (JP)

(73) Assignee: NEC Corporation, Tokyo (JP)

( * ) Notice: Subject to any disclaimer, the term of this patent is extended or adjusted under 35 U.S.C. 154(b) by 194 days.

(21) Appl. No.: 11/645,687

(22) Filed: Dec. 27, 2006

(65) Prior Publication Data

US 2007/0146042 A1    Jun. 28, 2007

(30) Foreign Application Priority Data

Dec. 28, 2005    (JP)    ............................... 2005-378575

(51) Int. Cl.
*H03L 5/00*    (2006.01)

(52) U.S. Cl. ........................................ 327/333; 326/62

(58) Field of Classification Search ................. 327/333; 326/62, 80, 81
See application file for complete search history.

(56) References Cited

U.S. PATENT DOCUMENTS

| | | | | |
|---|---|---|---|---|
| 6,084,459 | A * | 7/2000 | Jeong | 327/333 |
| 6,249,145 | B1 * | 6/2001 | Tanaka et al. | 326/68 |
| 6,819,159 | B1 * | 11/2004 | Lencioni | 327/333 |
| 6,930,518 | B2 * | 8/2005 | Kim et al. | 327/112 |
| 7,145,363 | B2 * | 12/2006 | Kim | 326/68 |
| 7,199,617 | B1 * | 4/2007 | Schrom et al. | 326/86 |
| 7,310,012 | B2 * | 12/2007 | Chen | 327/333 |

FOREIGN PATENT DOCUMENTS

| | | |
|---|---|---|
| JP | 59-154820 | 9/1984 |
| JP | 2-188024 | 7/1990 |

OTHER PUBLICATIONS

McCartney et al., "A Third Generation Timing Controller and Column Driver Architecture Using Point-to-Point Differential Signaling," *Society for Information Display*, 2004 International Symposium, Digest of Technical Papers, vol. 35, 2004, pp. 1556-1559.

* cited by examiner

*Primary Examiner*—Lincoln Donovan
*Assistant Examiner*—Hai L. Nguyen
(74) *Attorney, Agent, or Firm*—Foley & Lardner LLP

(57) ABSTRACT

A level shift circuit operates normally when amplitude of input signal is small and amplitude of output signal is large. First and second terminals receive an input signal and its complementary signal having a first amplitude. Third and fourth terminals output an output signal and its complementary signal having a second amplitude, which is larger than the first amplitude. Output circuit comprises first and second transistors of first polarity respectively connected between first power supply and fourth and third terminals, respectively. Third and fourth transistors of second polarity, respectively, are connected between second power supply and fourth and third terminals, respectively, having control ends connected to the third and the fourth terminals, respectively. First current control circuit controls so that a current driving the fourth terminal flows through the first transistor according to the input signal and the complementary signal of the output signal. Second current control circuit controls so that a current driving the third terminal flows through the second transistor according to the complementary signal of the input signal and the output signal.

20 Claims, 25 Drawing Sheets

LEVEL SHIFT CIRCUIT AND DRIVER CIRCUIT USING THE SAME

FIELD OF THE INVENTION

The present invention relates to a level shift circuit and a driver circuit using the same.

BACKGROUND OF THE INVENTION

In recent years, liquid crystal displays (LCD), characterized by their thinness, light-weightiness, and low power consumption, have been widely used as display devices, and it has become possible to realize a large-screen LCD TV as technologies to enlarge screens and support moving pictures are improved. As the liquid crystal display device, active matrix LCD devices allowing high definition display are currently in use. First, referring to FIG. 21, a typical configuration of an active matrix LCD device will be described. Note that a main structure connected to a pixel of the liquid crystal display unit is schematically shown by an equivalent circuit diagram in FIG. 21.

The display unit (a display panel) 960 of the active matrix LCD device is generally constituted by a semiconductor substrate on which transparent pixel electrodes 964 and thin film transistors (TFT) 963 are disposed in matrix (for instance 1280×3 pixel columns×1024 pixel rows in the case of a color SXGA panel), a counter-substrate having a transparent electrode 966 on the entire surface, and liquid crystal sealed between the two substrates.

The TFTs 963, having a switching function, are on/off controlled by a scanning signal, such that, when the TFTs 963 are turned on, a grayscale (gradation) voltage corresponding to a picture data signal is applied to the pixel electrodes 964 and the transmittance of the liquid crystal is changed by the potential difference between each pixel electrode 964 and the electrode 966 of the counter-substrate. A picture is displayed by having a liquid crystal capacitor 965 maintain this potential difference for a predetermined time.

On the semiconductor substrate, a lattice-like interconnection of data lines 962 that sends a plurality of level voltages (grayscale voltages) applied to each pixel electrode 964 and scanning lines 961 that sends scanning signals are formed (in the case of the aforementioned color SXGA panel, 1280×3 data lines and 1024 scanning lines). The scanning lines 961 and the data lines 962 represent a large capacitive load due to the capacitance generated at the intersections with each other and the capacitance of the liquid crystal interposed between the electrode of the counter-substrate and these lines.

Meanwhile, the scanning signals are supplied from a gate driver 970 to scanning lines 961, and the grayscale voltage is supplied to each pixel electrodes 964 by a data driver 980 via a data line 962. Further, the gate driver 970 and the data driver 980 are controlled by a display controller 950. A clock CLK, control signal, and power supply voltage they need are supplied by the display controller 950, and image data is supplied to the data driver 980. Currently, the image data is mainly digital data.

Data for one frame is rewritten every frame period (1/60 second) and is selected in order with each scanning line from one row of pixels to the next (every line). The grayscale voltage is supplied from each data line during the selection period.

Further, it is sufficient for the gate driver 970 to supply at least two-valued scanning signals, while the data driver 980 is required to drive the data lines with grayscale voltages of multi-valued levels corresponding to the number of grayscale levels. Therefore, the data driver 980 comprises a digital-to-analog converter circuit (DAC) composed of a decoder that converts the image data into grayscale voltages and an operation amplifier that amplifies the grayscale voltages and outputs it to the data lines 962.

Further, the recent trend in the liquid crystal display devices is to demand higher picture quality (higher resolution grayscale) and as a result, the voltage amplitudes of the scanning signals and the grayscale signals have a tendency to increase. For this reason, the gate driver 970 and the data driver 980 are demanded to output high voltages. Meanwhile, it is demanded to transfer various control signals and image data signals supplied to the gate driver 970 and the data driver 980 from the display controller 950 at high speed with a small number of wirings and low EMI, and the amplitudes of these signals have a tendency to decrease. Further, even inside the gate driver 970 and the data driver 980, in order to reduce an increase in the area of a logic circuit (an increase in costs) that processes data whose amount also grows as the grayscale resolution increases, a micro process is employed and as a result, the power supply voltage of the logic circuit has a tendency to decrease.

In other words, the gate driver 970 and the data driver 980 are demanded to receive a low voltage and output a high voltage. Therefore, a level shift circuit that converts a low voltage signal at the input into a high voltage signal at the output must convert a low amplitude signal into a high amplitude signal at high speed.

[Non-Patent Document 1]
"Introduction to Super LSI Series 5: Basics of MOS Integrated Circuit)," Kindai Kagaku Sha Co., Ltd., pp. 157-167 (FIG. 5-42).

[Non-Patent Document 2]
Society for Information Display, 2004 International Symposium, Digest of Technical Papers, Volume XXXV, 2004 pp. 1556-1559.

[Patent Document 1]
Japanese Patent Kokai Publication No. JP-A-50-151433

[Patent Document 2]
Japanese Patent Kokai Publication No. JP-A-2-188024

[Patent Document 3]
Japanese Patent Kokai Publication No. JP-A-59-154820

SUMMARY OF THE DISCLOSURE

The disclosures of the above mentioned documents are incorporated herein by reference thereto.

However, in a conventional level shift circuit, an error operation is likely to occur when the ratio of the input amplitude against the output amplitude is small. The inventor of the present application has investigated this problem, and the results are as follows.

Conventional level shift circuits schematically shown in FIGS. 22, 23, and 24 receive a low amplitude signal IN of a voltage between a low potential power supply VSS and a power supply VDD1 and an inverted signal INB of the signal IN from input terminals 1 and 2 respectively, and output a high amplitude signal OUT of a voltage between the low potential power supply VSS and a power supply VDD2 (VDD2>VDD1) having the same phase as the input signal IN and an inverted signal OUTB of the signal OUT from output terminals 3 and 4.

FIG. 22 is a drawing showing a typical configuration example of the conventional level shift circuit. Referring to FIG. 22, there are provided NMOS transistors 901 and 902 having the sources connected to VSS and the gates connected to the differential inputs IN and INB (amplitude VDD1-VSS) respectively, and PMOS transistors 903 and 904 having the sources connected to the power supply VDD2, and the drains connected to the drains of the NMOS transistors 901 and 902 with each connection node connected to the outputs OUTB and OUT respectively. The gates of the PMOS transistor 903 and 904 are crosswisely connected (termed "cross-connected") to the outputs OUT and OUTB.

In this configuration, an error operation and a through current are likely to occur when the potentials of the input signals IN and INB change because the discharging of the transistors 901 and 902 and the charging of the transistors 903 and 904 simultaneously and transitionally occur.

More concretely, for instance, let's say the input signals IN and INB are at a LOW level (VSS) and a HIGH level (VDD1) respectively, and the output signals OUT and OUTB are at a LOW level (VSS) and a HIGH level (VDD2) respectively in an initial state. The transistors 901 and 902 are turned off and on respectively, and the transistors 903 and 904 are turned on and off respectively.

When the input signals IN and INB change to a HIGH level and a LOW level, respectively, from the initial state, the transistors 901 and 902 are turned on and off respectively immediately after the changes. Further, the output signals OUT and OUTB are at the LOW level and the HIGH level respectively, and the transistors 903 and 904 are turned on and off respectively, also immediately after the changes.

Therefore, in order for the level shift circuit to operate normally, the transistor 901 lowers the potential of the output signal OUTB to a LOW level with a discharging capacity higher than the charging capacity of the transistor 903. When the potential of the output signal OUTB is at the LOW level, the transistor 904 is turned on and raises the potential of the output signal OUT to the power supply potential VDD2. As a result, the transistor 903 is turned off, completing the level shift operation.

Therefore, an error operation is more likely to occur when the amplitude of the input signal IN is small due to the fact that the discharging capacity of the transistor 901 decreases (the drain current of the transistor 901 becomes low).

Further, even when the level shift circuit operates normally, there will be a period when the transistors 901 and 903 are both turned on, and a through current from the power supplies VDD2 to VSS will occur, increasing the power consumption if the level change of the output signal OUTB is slow. Then, the level change of the output signal OUT becomes slow.

FIG. 23 shows an improved level shift circuit, compared to the configuration in FIG. 22, and transistors 905 and 906 are provided in an intermediate stage, in addition to the configuration in FIG. 22. There are provided NMOS transistors 901 and 902 having the sources connected to VSS and the gates connected to the differential inputs IN and INB respectively, PMOS transistors 903 and 904 having the sources connected to the power supply VDD2, and PMOS transistors 905 and 906 having the sources connected to the drains of the PMOS transistors 903 and 904, the drains connected to the drains of the NMOS transistors 901 and 902 with the connection nodes connected to the outputs OUTB and OUT respectively, and the gates connected to IN and INB. The gates of the PMOS transistor 903 and 904 are cross-connected to the outputs OUT and OUTB, respectively.

Regarding the configuration in FIG. 23, for instance, let's assume that the input signals IN and INB are at a LOW level (VSS) and a HIGH level (VDD1) respectively, and the output signals OUT and OUTB are at a LOW level (VSS) and a HIGH level (VDD2) respectively in an initial state. The transistors 901 and 902 are turned off and on respectively, and the transistors 903 and 904 are turned on and off respectively.

When the input signals IN and INB change to a HIGH level and a LOW level respectively from the initial state, the transistors 901 is turned on immediately after the changes, and a drain current flows. Then a drain-source potential difference VDS corresponding to this current occurs in the transistor 905, and the level of the output signal OUTB instantly drops from the HIGH level as much as the amount of the drain-source potential difference VDS of the transistor 905. As described, the level of the output signal OUTB is immediately lowered, and the transistor 904 is turned on. The potential of the output signal OUT is raised to the potential of the second power supply VDD2, and the transistor 903 is turned off, competing the level shift operation.

However, when the potential difference between the low potential power supply voltage VSS and the power supply voltage VDD2 is large, the effect for the fast operation by the drop of the voltage as much as the amount of the drain-source potential difference of the transistor 905 is lowered, and similar problems as those of the configuration in FIG. 22 occur.

In the configurations shown in FIGS. 22 and 23, in order to prevent error operations and the increase in power consumption, the sizes of the transistor 901 and 902 have to be sufficiently large so that they will have a high discharging capacity.

Particularly, when the amplitude of the input signal is small and its HIGH level potential VDD1 is relatively close to the threshold voltage of the transistors 901 and 902, the sizes of the transistors 901 and 902 have to be very large. Further, in this case, in order to drive the large transistors 901 and 902, the size of a buffer circuit that supplies the input signal must be large as well.

On the other hand, as a level shift circuit capable of operating normally even when the amplitude of the input signal is small and the amplitude of the output signal is large, a circuit is proposed in Patent Document 2, which is like ones shown in FIG. 24.

In the configuration shown in FIG. 24, first and second current supply circuits are added to the level shift circuit shown in FIG. 22 (M81, M82, M83, and M84 in FIG. 24).

The first current supply circuit operates only when the input signal IN changes from the LOW level (VSS) to the HIGH level (VDD1). The second current supply circuit operates only when the input signal INB changes from the LOW level (VSS) to the HIGH level (VDD1).

The first current supply circuit comprises a PMOS transistor M85 having the source connected to a power supply VDD2, and the drain and the gate connected to each other, a PMOS transistor M86 having the source connected to the power supply VDD2, and the gate connected to the gate of the PMOS transistor M85, an NMOS transistor M89 having the drain connected to the drain of the PMOS transistor M85, and the gate connected to IN, and an NMOS transistor M90 having the drain connected to the source of the NMOS transistor M89, the gate connected to OUTB, and the source connected to VSS. The second current supply circuit comprises a PMOS transistor M88 having the source connected to the power supply VDD2, and the drain and the gate connected to each other, a PMOS transistor M87 having the source connected to the power supply VDD2, and the gate connected to the gate of the PMOS transistor M88, an NMOS transistor M91 having the drain connected to the drain of the PMOS transistor M88, and the gate connected to INB, and an NMOS transistor M92 having the drain connected to the source of the NMOS transistor M91, the gate connected to OUT, and the source connected to VSS.

In an initial state, the input signals IN and INB are at a LOW level (VSS) and a HIGH level (VDD1) respectively, and the output signals OUT and OUTB are at a LOW level (VSS) and a HIGH level (VDD2) respectively. The transistors M81 and M82 are at off and on respectively, and the transistors M83 and M84 are at on and off respectively. The case where the input signals IN and INB respectively change to a HIGH level and a LOW level from the initial state will be described.

Immediately after the changes, the transistors M81 and M82 are turned on and off respectively. Also, immediately after the changes, the output signals OUT and OUTB are at the LOW level and the HIGH level respectively, and the transistors M83 and M84 are turned on and off respectively.

At this time, the gates of the transistors M89 and M90 in the first current supply circuit receive the HIGH level signal and they are both turned on. A current corresponding to the gate voltage (VDD1) and the source voltage (VSS) of the transistor M89 is outputted through a current mirror (M85 and M86), charging the output terminal OUT.

The output current of the transistor M86 raises the potential of the output signal OUT, turning the transistor M83 off.

Meanwhile, the transistor M81 (turned on) lowers the potential of the output signal OUTB, and the transistor M84 is turned on, completing the level shift operation. Further, when the potential of the output signal OUTB is lowered, the transistor M90 of the first current supply circuit is turned off and the first current supply circuit stops operating.

In FIG. 24, since the transistor M83 is turned off by the first current supply circuit immediately after the changes (to High) from the initial state (Low), the transistor M81 is able to lower the potential of the output signal OUTB even without the high discharging capacity necessary for the transistor 901 in FIGS. 22 and 23. Therefore, the level shift operation can be performed reliably.

Further, the second current supply circuit operates when the input signal INB changes from a LOW level to a HIGH level, and the level shift operation can be reliably performed as well.

Therefore, the configuration shown in FIG. 24 offers higher operating reliability than the circuits shown in FIGS. 22 and 23 when the amplitude of the input signal is small and the amplitude of the output signal is large.

As mentioned above, the level shift circuit used in the driver circuit of a display device is demanded to operate reliably at high speed when the amplitude of the input signal is small and the amplitude of the output signal is large.

As a result of the analysis by the inventor of the present application, it has been realized that, in the level shift circuit shown in FIG. 24, the output signals OUT and OUTB can change from a LOW level to a HIGH level at high speed, however, delay sometimes occurs in the change from a HIGH level to a LOW level.

More concretely, the ability of the configuration shown in FIG. 24 to raise the potentials of the output signals OUT and OUTB can increase the charging current and enhance the charging capacity by increasing the amplification ratio of the output current against the input current in the current mirrors (M85 and M86), (M87 and M88) of the first and second current supply circuit.

On the other hand, the ability to lower the potentials of the output signals OUTB and OUT depends on the transistors M81 and M82, and it is difficult to obtain a sufficient discharging capacity when the HIGH level potentials of the amplitudes of the input signals IN and INB are relatively close to the threshold voltage of the transistors M81 and M82 even if the sizes of the transistors M81 and M82 are large.

For the level shift circuit shown in FIG. 24, the circuit simulation of its operation using SPICE is performed. The result is shown in FIG. 25.

FIG. 25 shows the input/output waveforms of the input signal IN and the output signal OUT in the level shift circuit shown in FIG. 24. When the input signal and the output signal are at HIGH levels, the potentials of these signals are 1V (VDD1) and 12V (VDD2) respectively, and when they are at LOW levels, the potentials of the both signals are at the GND level. The HIGH level potential of the input signal, 1V, is only slightly higher than the threshold voltage of the transistors M81 and M82, 0.8V.

As evident from FIG. 25, since the HIGH level potential of the input signal is close to the threshold voltage of the transistors M81 and M82, they do not have a sufficient discharging capability, and the lowering of the level of the output signal OUT is delayed. Note that voltages convenient for confirming the operation and the effects are used in this simulation, and they are not necessarily the same as real world voltages used in the driver circuit of a display device.

Therefore, it is an object of the present invention to provide a level shift circuit capable of operating reliably and at high speed even when the amplitude of the input signal is small and the amplitude of the output signal is large, and to provide a gate driver and a data driver using the same.

In order to solve the problems described above, the invention disclosed in the present application is structured as follows.

According to an aspect of the present invention there is provided a level shift circuit that comprises first and second terminals that respectively receive an input signal and a complementary signal of the input signal having a first amplitude, third and fourth terminals that respectively output an output signal and a complementary signal of the output signal having a second amplitude, which is larger than the first amplitude, an output circuit comprising first and second transistors of a first polarity respectively connected between a first power supply and the fourth terminal and between the first power supply and the third terminal, and third and fourth transistors of a second polarity, respectively connected between a second power supply and the fourth terminal and between the second power supply and the third terminal, having control ends connected to the third and the fourth terminals respectively, a first current control circuit that receives the input signal and the complementary signal of the output signal at the first terminal and the fourth terminal, that outputs first voltage signal to the control end of the first transistor according to potentials of the input signal and the complementary signal of the output signal, and that drive-controls a current flowing through the first transistor, and a second current control circuit that receives the complementary signal of the input signal and the output signal at the second terminal and the third terminal, that outputs second voltage signal to the control end of the second transistor according to potentials of the complementary signal of the input signal and the output signal, and that drive-controls a current flowing through the second transistor.

In the present invention, the input signal and its complementary signal are not supplied from the first terminal and the second terminal to control ends of the first and second transistors in the output circuit, a value of a differential potential between a potential of the control end of the first transistor and the first power supply potential is settable to values not less than the first amplitude (but not more than the second amplitude) when the first transistor is turned on by activating the first current control circuit, and a value of a differential potential between a potential of the control end of the second transistor and the first power supply potential is settable to values not less than the first amplitude (but not more than the second amplitude) when the second transistor is turned on by activating the second current control circuit.

In the present invention, it is preferable that the first current control circuit be activated when the input signal and the complementary signal of the output signal from the first and the fourth terminals are both at a second logical value, turn on the first transistor, and be deactivated and turn off the first transistor after the turned-on first transistor changes the complementary signal of the output signal from the second logical value to a first logical value of potential. Further, it is preferable that the second current control circuit be activated when the complementary signal of the input signal and the output signal from the second and the third terminals are both at the second logical value, turn on the second transistor, and be deactivated and turn off the second transistor after the turned-on second transistor changes the output signal from the second logical value to the first logical value of potential.

In the present invention, it is preferable that the first current control circuit comprise a first current generator circuit, having one end connected to the first power supply and comprising two transistors, connected in series, that respectively receive the input signal and the complementary signal of the output signal at control ends, and a first current-voltage conversion circuit that converts an output current of the first current generator circuit into the first voltage signal, and outputs it to the control end of the first transistor. Further, it is preferable that the second current control circuit comprise a second current generator circuit, having one end connected to the first power supply and comprising two transistors, connected in series, that respectively receive the complementary signal of the input signal and the output signal at control ends, and a second current-voltage conversion circuit that converts an output current of the second current generator circuit into the second voltage signal, and outputs it to the control end of the second transistor.

In the present invention, it is preferable that the first current control circuit comprise a first current generator circuit comprising fifth and sixth transistors of a first polarity, connected in series, having one end connected to the first power supply and receiving the input signal and the complementary signal of the output signal at a respective control end, a first resistance connected between an output end of the first current generator circuit and the second power supply, and a seventh transistor of a second polarity, having a control end connected to the output end of the first current generator circuit, and a second resistance connected in series between the first and the second power supplies, and that a connection node between the seventh transistor and the second resistance be connected to the control end of the first transistor. Further, it is preferable that the second current control circuit comprise a second current generator circuit comprising eighth and ninth transistors of the first polarity, connected in series, having one end connected to the first power supply and receiving the complementary signal of the input signal and the output signal at a respective control end, a third resistance connected between an output end of the second current generator circuit and the second power supply, and a tenth transistor of the second polarity, having a control end connected to the output end of the second current generator circuit, and a fourth resistance connected in series between the first and the second power supplies, and that a connection node between the tenth transistor and the fourth resistance be connected to the control end of the second transistor.

In the present invention, at least one of the first to the fourth resistances may be constituted by a diode-connected transistor or a current source.

In the present invention, the output circuit may comprise a transistor of a first polarity connected in parallel with the first transistor between the fourth terminal and the first power supply and on/off controlled according to the input signal, and a transistor of a first polarity connected in parallel with the second transistor between the third terminal and the first power supply and on/off controlled according to the complementary signal of the input signal.

In the present invention, there may be further provided a transistor of a second polarity, connected between the second power supply and the third terminal, having a control end connected to the output end of the first current generator circuit, and a transistor of a second polarity, connected between the second power supply and the fourth terminal, having a control end connected to the output end of the second current generator circuit.

A scanning driver relating to another aspect of the present invention outputs a scanning signal according to a timing signal that it receives, and comprises the above-described level shift circuit relating to the present invention.

A data driver relating to a further aspect of the present invention drives a data line according to a digital data signal that it receives and comprises the above-described level shift circuit relating to the present invention. This data driver receives an output from the level shift circuit and comprises a digital-to-analog converter that outputs a grayscale voltage.

A receiver circuit relating to a yet further aspect of the present invention comprises a differential circuit that differentially receives and outputs digital data signals, and a level shift circuit that differentially receives outputs of the differential circuit at first and second terminals and that outputs level-shifted signal and its complementary signal from third and fourth terminals, and the level shift circuit is the above-described level shift circuit relating to the present invention.

The meritorious effects of the present invention are summarized as follows.

According to the present invention, a level shift circuit capable of operating reliably at high speed even with a small input signal amplitude, or a low signal voltage, and a large amplitude of a signal level-shifted and outputted is realized while avoiding output delay and error operations, and it is capable of meeting the demands for higher speed and reliability. Further, according to the present invention, the circuit is suitable for use as a driver of such a display device. Further, it becomes suitable for use in a receiver circuit by having the level shift circuit of the present invention in a stage following a differential circuit that differentially receives input signals.

PREFERRED MODES OF THE INVENTION

Figure 1:
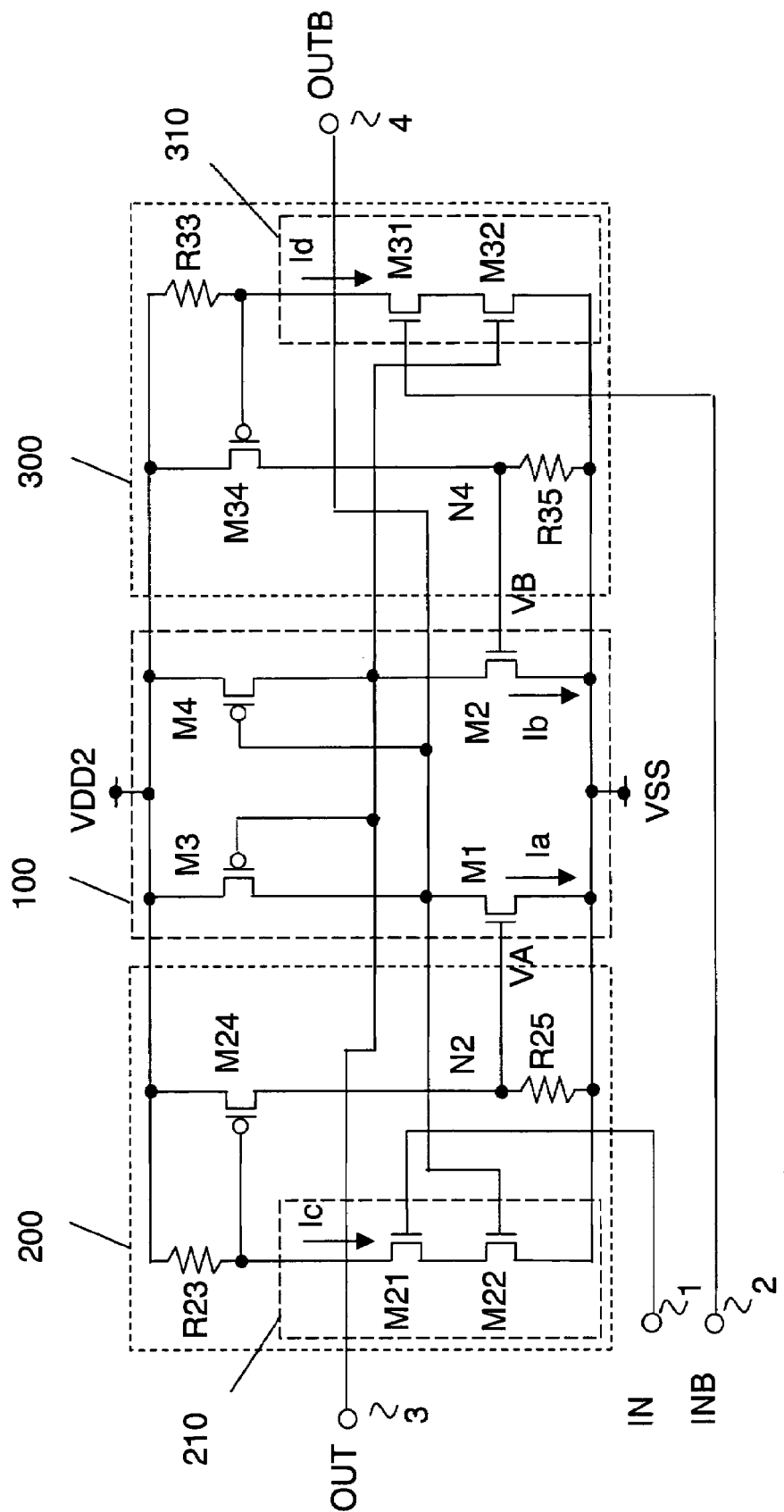
FIG. 1 is a drawing illustrating the configuration of a level shift circuit of a first example of the present invention.

The various aspects and modes of the present invention will be further described in detail with reference to the attached drawings. A level shift circuit relating to a first example of the present invention comprises first and second terminals (1 and 2) that respectively receive an input signal (IN) and its complementary signal (INB) having a first amplitude, third and fourth terminals (3 and 4) that respectively output an output signal (OUT) and its complementary signal (OUTB) having a second amplitude, which is larger than the first amplitude, an output circuit (100) comprising first and second transistors (M1 and M2) of a first polarity respectively connected between a first power supply (VSS) and the fourth terminal and between the first power supply (VSS) and the third terminal, and third and fourth transistors (M3 and M4) of a second polarity, respectively connected between a second power supply (VDD2) and the first transistor (M1) and between the second power supply (VDD2) and the second transistor (M2), having the control ends connected to the third and the fourth terminals (3, 4) respectively, a first current control circuit (200) that outputs first voltage signal (VA) to the control end of the first transistor (M1) according to a combination of the values of the input signal (IN) and the complementary signal (OUTB) of the output signal, and that changes the potential of the complementary signal (OUTB) of the output signal at the fourth terminal (4) to the potential of the first power supply (VSS) by drive-controlling a current (Ia) flowing through the first transistor (M1), and a second current control circuit (300) that outputs second voltage signal (VB) to the control end of the second transistor (M2) according to a combination of the values of the complementary signal (INB) of the input signal and the output signal (OUT), and that changes the potential of the output signal (OUT) at the third terminal (3) to the potential of the first power supply (VSS) by drive-controlling a current (Ib) flowing through the second transistor (M2).

The first current control circuit (200) comprises a first current generator circuit (210), connected to the first power supply (VSS), comprising two transistors (M21 and M22), connected in series, that respectively receive the input signal (IN) and the complementary signal (OUTB) of the output signal at the control ends, and a first current-voltage conversion circuit that converts an output current (Ic) of the first current generator circuit (210) into the first voltage signal (VA), and outputs it to the control end of the first transistor (M1). The second current control circuit (300) comprises a second current generator circuit (310), connected to the first power supply (VSS), comprising two transistors (M31 and M32), connected in series, that respectively receive the complementary signal (INB) of the input signal and the output signal (OUT) at the control ends, and a second current-voltage conversion circuit that converts an output current (Id) of the second current generator circuit (310) into the second voltage signal (VB), and outputs it to the control end of the second transistor (M2).

How the present example works will be described. In the first current control circuit (200), when the input signal (IN) and the complementary signal (OUTB) of the output signal both have the potential of a second logical value, the two transistors (M21 and M22) in the first current generator circuit (210) are turned on and the current (Ic) is generated. The current (Ic) is converted by the first current-voltage conversion circuit into the first voltage signal (VA) within a voltage range between the first power supply (VSS) and the second power supply (VDD2), and the signal is outputted to the control end of the first transistor (M1), thereby turning the first transistor (M1) on when the current (Ic) occurs. At this time, the current (Ia) flows across the fourth terminal (4) and the first power supply (VSS) due to the current (Ia) flowing through the first transistor (M1), and the potential of the complementary signal (OUTB) of the output signal at the fourth terminal (4) changes from the second logical value to a first logical value. Because of this, the fourth transistor (M4) having the control end (gate) connected to the fourth terminal (4) is turned on as well, and the potential of the output signal (OUT) at the third terminal (3) changes from the first logical value to the second logical value due to the current flowing through the fourth transistor (M4). Further, once the potential of the complementary signal (OUTB) of the output signal changes from the second logical value to the first logical value, one of the two transistors (M21 and M22) in the first current generator circuit (210) is turned off, cutting off the current (Ic), and the first current control circuit (200) stops operating.

In the second current control circuit (300), when the complementary signal (INB) of the input signal and the output signal (OUT) both have the potential of the second logical value, the two transistors (M31 and M32) in the second current generator circuit (310) are turned on and the current (Id) is generated. The current (Id) is converted by the second current-voltage conversion circuit into the second voltage signal (VB) within a voltage range between the first power supply (VSS) and the second power supply (VDD2), and the signal is outputted to the control end of the second transistor (M2), thereby turning the second transistor (M2) on when the current (Id) occurs. At this time, the current (Ib) flows across the third terminal (3) and the first power supply (VSS) due to the current (Ib) flowing through the second transistor (M2), and the potential of the output signal (OUT) at the third terminal (3) changes from the second logical value to the first logical value. Because of this, the third transistor (M3) having the control end connected to the third terminal (3) is turned on as well, and the potential of the complementary signal (OUTB) of the output signal (OUT) at the fourth terminal (4) changes from the first logical value to the second logical value due to the current flowing through the third transistor (M3). Further, once the potential of the output signal (OUT) changes from the second logical value to the first logical value, one of the two transistors (M31 and M32) in the second current generator circuit (310) is turned off, cutting off the current (Id), and the second current control circuit (300) stops operating.

The potentials of the first and the second logical values that determine the amplitude of the input signal (IN) and its complementary signal (INB) are two voltage values higher than and lower than the threshold voltage of the transistor that receives the input signal or its complementary signal at the control end. Further, the relationships between the first and the second power supplies, the first and the second logical values, and the first and the second polarities of the transistors are as follows. When the potential of the second power supply (VDD2) is higher than that of the first power supply (VSS), the transistors of the first and the second polarities are transistors of N-channel and P-channel types respectively, and the first and the second logical values are LOW level and HIGH level respectively. On the other hand, when the potential of the second power supply (VDD2) is lower than that of the first power supply (VSS), the transistors of the first and the second polarities are transistors of P-channel and N-channel types respectively, and the first and the second logical values are HIGH level and LOW level respectively.

In an example of the present invention, the first current control circuit (200) comprises the first current generator circuit (210) comprising the two—the fifth and the sixth—transistors (M21 and M22) of the first polarity, connected in series, having one end connected to the first power supply (VSS) and receiving the input signal (IN) and the complementary signal (OUTB) of the output signal at the respective control end, a first resistance (R23) connected between the output end of the first current generator circuit and the second power supply (VDD2), and a seventh transistor (M24) of the second polarity, having the control end connected to the output end of the first current generator circuit, and a second load resistance (R25) connected in series across the first and the second power supplies (VSS and VDD2). The connection node N2 between the seventh transistor (M24) and the second resistance (R25) is an output end, and the connection node (N2) between the seventh transistor (M24) and the second resistance (R25) is connected to the control end (gate) of the first transistor (M1).

The second current control circuit (300) comprises the second current generator circuit (310) comprising the two—the eighth and the ninth—transistors (M31 and M32) of the first polarity, connected in series, having one end connected to the first power supply (VSS) and receiving the complementary signal (INB) of the input signal and the output signal (OUT) at the respective control end, a third resistance (R33) connected between the output end of the second current generator circuit and the second power supply (VDD2), and a tenth transistor (M34) of the second polarity, having the control end connected to the output end of the second current generator circuit, and a fourth resistance (R35) connected in series across the first and the second power supplies (VSS and VDD2). The connection node (N4) between the tenth transistor and the fourth resistance (R35) is an output end, and the connection node (N4) between the tenth transistor and the fourth resistance (R35) is connected to the control end (gate) of the second transistor (M2).

In an example of the present invention, the first to the fourth resistances may be replaced by diode-connected transistors or current sources.

In an example of the present invention, the first current control circuit (200) comprises the first current generator circuit (210) comprising the two—the fifth and the sixth—transistors (M21 and M22) of the first polarity, connected in series, having one end connected to the first power supply (VSS) and receiving the input signal (IN) and the complementary signal (OUTB) of the output signal at the respective control end, a diode-connected (the control end and an output end are connected) eleventh transistor (M23) of the second polarity connected between the output end of the first current generator circuit and the second power supply (VDD2), and the seventh transistor (M24) of the second polarity, having the control end connected to the control end of the eleventh transistor (M23), and a diode-connected twelfth transistor (M25) of the first polarity connected in series across the first and the second power supplies (VSS and VDD2). The control end (gate) of the twelfth transistor (M25) is connected to the control end (gate) of the first transistor (M1). In this configuration, the eleventh transistor (M23) and the seventh transistor (M24), and the twelfth transistor (M25) and the first transistor (M1) respectively function as a current mirror (transistor pair), and convert a current (Ic) generated in the first current generator circuit (210) into a current (Ia) flowing through the first transistor (M1). Further, the current (Ia) is converted into a current value obtained by amplifying the current (Ic) according to the size ratio between the two transistors forming each current mirror (transistor pair).

The second current control circuit (300) comprises the second current generator circuit (310) comprising the two—the eighth and the ninth—transistors (M31 and M32) of the first polarity, connected in series, having one end connected to the first power supply (VSS) and receiving the complementary signal (INB) of the input signal and the output signal (OUT) at the respective control end, a diode-connected (the control end and the output end are connected) thirteenth transistor (M33) of the second polarity connected between the output end of the second current generator circuit and the second power supply (VDD2), and the tenth transistor (M34) of the second polarity, having the control end connected to the control end of the thirteenth transistor (M33), and a diode-connected fourteenth transistor (M35) of the first polarity connected in series across the first and the second power supplies (VSS and VDD2). The control end (gate) of the fourteenth transistor (M35) is connected to the control end (gate) of the second transistor (M2). In this configuration, the thirteenth transistor (M33) and the tenth transistor (M34), and the fourteenth transistor (M35) and the second transistor (M2) respectively function as a current mirror (transistor pair), and convert the current (Id) generated in the second current generator circuit (310) into the current (Ib) flowing through the second transistor (M2). Further, the current (Ib) is converted into a current value obtained by amplifying the current (Id) according to the size ratio between the two transistors forming each current mirror (transistor pair).

In an example of the present invention, the first current control circuit (200) comprises the first current generator circuit (210) comprising the two—the fifth and the sixth—transistors (M21 and M22) of the first polarity, connected in series, having one end connected to the first power supply (VSS) and receiving the input signal (IN) and the complementary signal (OUTB) of the output signal at the respective control end, the diode-connected eleventh transistor (M23) of the second polarity connected between the output end of the first current generator circuit and the second power supply (VDD2), and the seventh transistor (M24) of the second polarity, having the control end connected to the control end of the eleventh transistor (M23), and the twelfth transistor (M25) of the first polarity connected in series between the first and the second power supplies (VSS and VDD2). The connection node (N2) between the seventh transistor (M24) and the twelfth transistor (M25) is connected to the control end of the first transistor (M1). A bias voltage (VB1) is supplied to the control end of the twelfth transistor (M25) of the first polarity by a bias circuit (400). In this configuration, the eleventh transistor (M23) and the seventh transistor (M24) function as a current mirror (transistor pair), and the twelfth transistor (M25) functions as a current source. Further, the potential of the control end of the first transistor (M1) is varied within a voltage range between the first power supply (VSS) and the second power supply (VDD2) according to the current (Ic) generated in the first current generator circuit (210). As a result, the current (Ia) flowing through the first transistor (M1) is converted into a current value obtained by amplifying the current (Ic).

The second current control circuit (300) comprises the second current generator circuit (310) comprising the two—the eighth and the ninth—transistors (M31 and M32) of the first polarity, connected in series, having one end connected to the first power supply (VSS) and receiving the complementary signal (INB) of the input signal and the output signal (OUT) at the respective control end, the diode-connected thirteenth transistor (M33) of the second polarity connected between the output end of the second current generator circuit and the second power supply (VDD2), and the tenth transistor (M34) of the second polarity, having the control end connected to the control end of the thirteenth transistor (M33), and the fourteenth transistor (M35) of the first polarity connected in series across the first and the second power supplies (VSS and VDD2). The connection node (N4) between the tenth transistor and the fourteenth transistor is connected to the control end of the second transistor (M2). The bias voltage (VB1) is supplied to the control end of the fourteenth transistor (M35) of the first polarity by the bias circuit (400). In this configuration, the thirteenth transistor (M33) and the tenth transistor (M34) function as a current mirror (transistor pair), and the fourteenth transistor (M35) functions as a current source. Further, the potential of the control end of the second transistor (M2) is varied within a voltage range between the first power supply (VSS) and the second power supply (VDD2) according to the current (Id) generated in the second current generator circuit (310). As a result, the current (Ib) flowing through the second transistor (M2) is converted into a current value obtained by amplifying the current (Id).

In an example of the present invention, the first current control circuit (200) comprises a first current generator circuit (210) comprising the two—the fifth and the sixth—transistors (M21 and M22) of the first polarity, connected in series, having one end connected to the first power supply (VSS) and receiving the input signal (IN) and the complementary signal (OUTB) of the output signal at the respective control end, the diode-connected eleventh transistor (M23) of the second polarity connected between the output end of the first current generator circuit and the second power supply (VDD2), and the seventh transistor (M24) of the second polarity, having the control end connected to the control end of the eleventh transistor (M23), and a twelfth transistor (M25A) of the first polarity connected in series across the first and the second power supplies (VSS and VDD2). The connection node (N2) between the seventh transistor and the twelfth transistor (M25A) is connected to the control end of the first transistor (M1), and the control end of the twelfth transistor (M25A) receives the input signal (IN). Further, in the first current control circuit, a fifteenth transistor (M25B) of the first polarity is provided in parallel with the twelfth transistor (M25A) of the first polarity, and the complementary signal (INB) of the input signal is fed to the control end of the fifteenth transistor (M25B). In this configuration, the twelfth transistor (M25A) or the fifteenth transistor (M25B) is always turned on, and functions as a current source having the potential (the second logical value) of the input signal (IN) or its complementary signal (INB) as a bias voltage.

The second current control circuit (300) comprises the second current generator circuit (310) comprising the two—the eighth and the ninth—transistors (M31 and M32) of the first polarity, connected in series, having one end connected to the first power supply (VSS) and receiving the complementary signal (INB) of the input signal and the output signal (OUT) at the respective control end, the diode-connected thirteenth transistor (M33) of the second polarity connected between the output end of the second current generator circuit (310) and the second power supply (VDD2), and the tenth transistor (M34) of the second polarity, having the control end connected to the control end of the thirteenth transistor (M33), and a fourteenth transistor (M35A) of the first polarity connected in series across the first and the second power supplies (VSS and VDD2). The connection node (N4) between the tenth transistor (M34) and the fourteenth transistor (M35A) is connected to the control end of the second transistor (M2), and the control end of the fourteenth transistor (M35A) receives the complementary signal (INB) of the input signal. Further, in the second current control circuit, a sixteenth transistor (M35B) of the first polarity is provided in parallel with the fourteenth transistor (M35A) of the first polarity, and the input signal (IN) is fed to the control end of the sixteenth transistor (M35B). In this configuration, the fourteenth transistor (M35A) or the sixteenth transistor (M35B) is always turned on, and functions as a current source having the potential (the second logical value) of the input signal (IN) or its complementary signal (INB) as a bias voltage.

In an example of the present invention, the first current control circuit (200) comprises the first current generator circuit (210) comprising the two—the fifth and the sixth—transistors (M21 and M22) of the first polarity, connected in series, having one end connected to the first power supply (VSS) and receiving the input signal (IN) and the complementary signal (OUTB) of the output signal at the respective control end, the diode-connected eleventh transistor (M23) of the second polarity connected between the output end of the first current generator circuit and the second power supply (VDD2), and the seventh transistor (M24) of the second polarity, having the control end connected to the control end of the eleventh transistor (M23), and a first current source (M25) connected in series across the first and the second power supplies (VSS and VDD2). The connection node (N2) between the seventh transistor (M24) and the first current source (M25) is connected to the control end of the first transistor (M1). Further, in the first current control circuit, a twelfth transistor (M26) of the first polarity is provided in parallel with the first current source (M25), and the control end of the twelfth transistor (M26) is connected to the control end of the second transistor (M2) (via the node N4). In this configuration, the twelfth transistor (M26) functions so that the potential of the control end of the first transistor (M1) is changed to that of the first power supply (VSS), ensuring that the first transistor (M1) is turned off, when the second current control circuit (300) starts to operate after the output current (Ic) of the first current generator circuit (210) is cut off.

The second current control circuit (300) comprises the second current generator circuit (310) comprising the two— the eighth and the ninth—transistors (M31 and M32) of the first polarity, connected in series, having one end connected to the first power supply (VSS) and receiving the complementary signal (INB) of the input signal and the output signal (OUT) at the respective control end, the diode-connected thirteenth transistor (M33) of the second polarity connected between the output end of the second current generator circuit and the second power supply (VDD2), and the tenth transistor (M34) of the second polarity, having the control end connected to the control end of the thirteenth transistor (M33), and a second current source (M35) connected in series between the first and the second power supplies (VSS and VDD2). The connection node (N4) between the tenth transistor (M34) and the second current source (M35) is connected to the control end of the second transistor (M2). Further, in the second current control circuit, a fourteenth transistor (M36) of the first polarity is provided in parallel with the second current source (M35), and the control end of the fourteenth transistor (M36) is connected to the control end of the first transistor (M1) (via the node N2). In this configuration, the fourteenth transistor (M36) functions so that the potential of the control end of the second transistor (M2) is changed to that of the first power supply (VSS), ensuring that the second transistor (M2) is turned off, when the first current control circuit (200) starts to operate after the output current (Id) of the second current generator circuit (310) is cut off.

In an example of the present invention, the output circuit (100) may comprise a transistor (M5) of the first polarity, connected in parallel with the first transistor (M1) between the fourth terminal (4) and the first power supply (VSS) and on/off controlled according to the input signal (IN), having the control end connected to the first terminal (1), and a transistor (M6) of the first polarity, connected in parallel with the second transistor (M2) between the third terminal (3) and the first power supply (VSS) and on/off controlled according to the complementary signal (INB) of the input signal, having the control end connected to the second terminal (2). In this configuration, the transistor (M5) of the first polarity is turned on when the input signal (IN) is at the second logical value, and functions so that the complementary signal (OUTB) of the output signal is held at a potential of the first power supply (VSS). Further, the transistor (M6) of the first polarity is turned on when the complementary signal (INB) of the input signal is at the second logical value, and functions so that the output signal (OUT) is held at a potential of the first power supply (VSS). As a result, the fluctuations of the output signal (OUT) and its complementary signal (OUTB) caused by various noise such as power supply noise can be suppressed.

In an example of the present invention, there may be further provided a transistor (M27) of the second polarity, connected between the second power supply (VDD2) and the third terminal (3), having the control end connected to the output end of the first current generator circuit (210), and a transistor (M37) of the second polarity, connected between the second power supply (VDD2) and the fourth terminal (4), having the control end connected to the output end of the second current generator circuit (310). In this configuration, the transistor (M27) lets a current flow between the second power supply (VDD2) and the third terminal (3) and functions so that the potential of the output signal (OUT) changes to that of the second power supply (VDD2) when the output current (Ic) of the first current generator circuit occurs. As a result, the third transistor (M3) is turned off, and the potential of the complementary signal (OUTB) of the output signal changes to that of the first power supply (VSS) quickly. Furthermore, the transistor (M37) lets a current flow between the second power supply (VDD2) and the fourth terminal (4) and functions so that the potential of the complementary signal (OUTB) of the output signal changes to that of the second power supply (VDD2) when the output current (Id) of the second current generator circuit occurs. As a result, the fourth transistor (M4) is turned off, and the potential of the output signal (OUT) changes to that of the first power supply (VSS) quickly.

A scanning driver of an example of the present invention outputs a scanning signal according to a timing signal supplied and comprises the level shift circuit described above.

A data driver that drives a data line according to a digital data signal supplied comprises the level shift circuit described above.

A receiver circuit of an example of the present invention comprises a differential circuit that differentially receives and outputs a digital data signal and the level shift circuit that receives the output of the differential circuit at the first and the second terminals. The present invention will be described in detail with reference to examples.

DETAILED DESCRIPTION OF EXAMPLES

FIG. 1 is a drawing illustrating the configuration of a first example of the present invention. Referring to FIG. 1, a level shift circuit relating to the first example of the present invention comprises the output circuit 100 and the first and the second current control circuits 200 and 300.

The output circuit 100 comprises MOS transistors M1 and M2 having the sources connected to a low potential power supply VSS and the drains connected to output terminals 4 and 3 respectively, and NMOS transistors M3 and M4 having the sources connected to a high potential power supply VDD2 and the drains connected to the output terminals 4 and 3 respectively.

The first current control circuit 200 comprises a first current generator circuit 210 where the NMOS transistors M21 and M22, having the gates connected to a terminal 1 (the input signal IN) and the terminal 4 (the output signal OUTB) respectively, are connected in series, a resistance R23 connected between the high potential power supply VDD2 and the drain of the transistor M21, a PMOS transistor M24 having the source connected to the power supply VDD2 and the gate connected to a connection node Ni between the drain of the transistor M21 and the resistance R23, and a resistance R25 connected between the drain of the PMOS transistor M24 and the low potential power supply VSS. A connection node N2 between the resistance R25 and the drain of the transistor M24 is connected to the gate of the transistor M1.

The second current control circuit 300 comprises the second current generator circuit 310 where the NMOS transistors M31 and M32, having the gates connected to a terminal 2 (the input signal INB) and the terminal 3 (the output signal OUT) respectively, are connected in series, the resistance R33 connected between the high potential power supply VDD2 and the drain of the transistor M31, a PMOS transistor M34 having the source connected to the power supply VDD2 and the gate connected to a connection node N3 between the drain of the transistor M31 and the resistance R33, and a resistance R35 connected between the drain of the PMOS transistor M34 and the power supply VSS. A connection node N4 between the resistance R35 and the drain of the transistor M34 is connected to the gate of the transistor M2.

The current generator circuits 210 and 310 generate the output currents Ic and Id only when the input signals IN or INB changes from a LOW level to a HIGH level, and control the transistors M1 and M2 in the output circuit 100 so that the voltages OUTB and OUT of the output terminal 4 and the output terminal 3 are lowered to a LOW level (VSS) at high speed by these currents. In the configuration shown in FIG. 1, the input signals IN and INB are received by the gates of the transistors M21 and M31, and are not directly received by the gates of the transistors M1 and M2 in the output circuit 100. The operating principle is as follows. Since OUTB is at a HIGH level (VDD2) when the input signal IN changes from the LOW level to the HIGH level, the transistors M21 and M22 are turned on, and the potential of the node N1 drops, turning on the transistor M24. A current flows through the resistance R25, raising the gate potential (at node N2) of the transistor M1, turning it on, and discharging the output terminal 4, thereby changing the output signal OUTB to the LOW level (VSS). Meanwhile, since the output terminal 3 OUT is at the HIGH level (VDD2) when the input signal INB changes from the LOW level to the HIGH level, the transistors M31 and M32 are turned on, and the potential of the node N3 drops, thereupon turning on the transistor M34. A current flows through the resistance R35, raising the gate potential (at node N4) of the transistor M2, turning it on, and discharging the output terminal 3, and the output signal OUT is changed to the LOW level (VSS).

Figure 19:
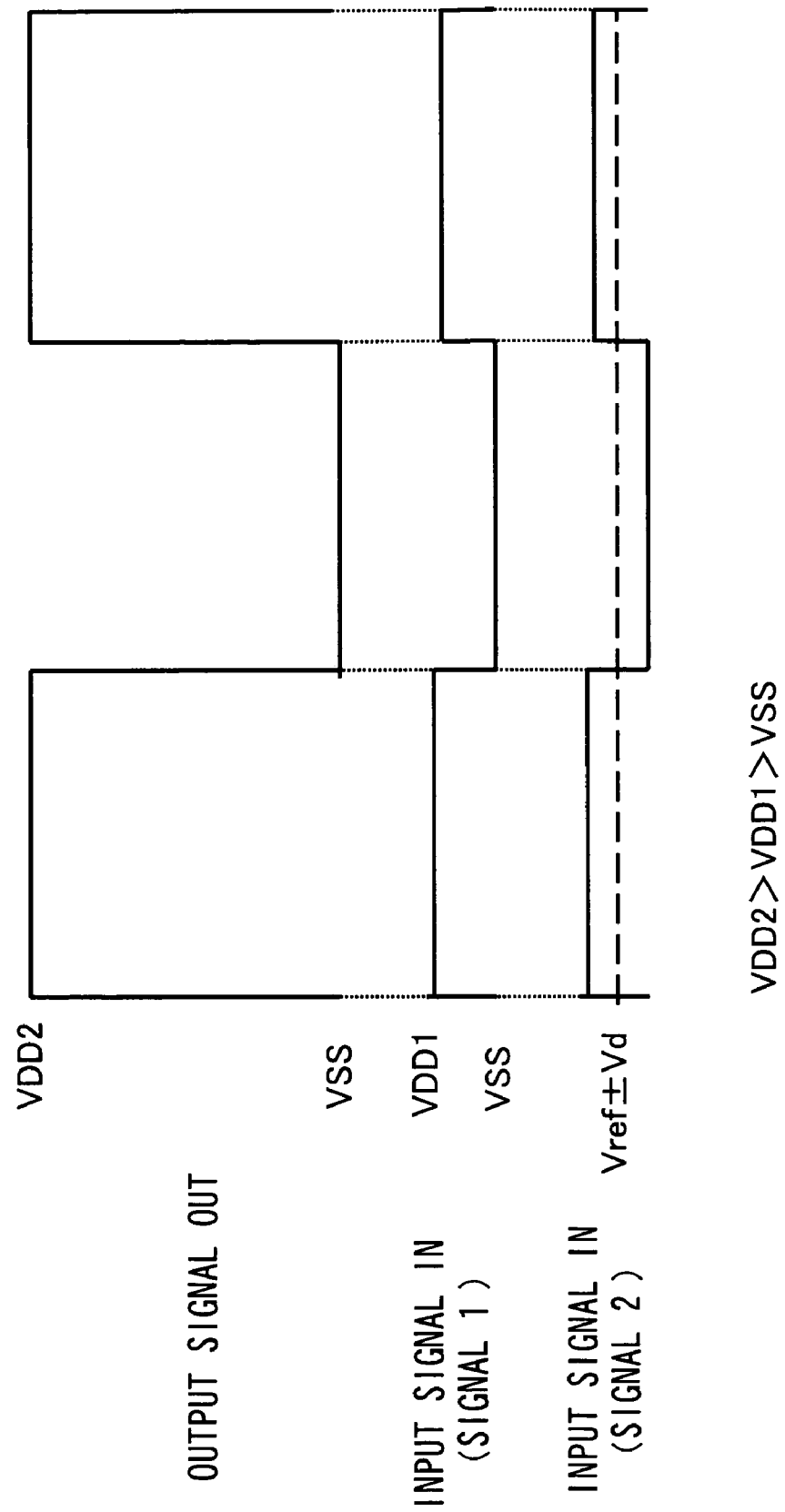
FIG. 19 is a drawing showing input/output waveforms of the circuit shown in FIG. 1.

The level shift circuit shown in FIG. 1 is capable of receiving the low-amplitude input signal IN shown in FIG. 19 and its complementary signal INB, and outputting the high-amplitude output signal OUT having the same phase as the input signal IN and its complementary signal OUTB. Note that only the non-inverted signals IN and OUT of the input signal and the output signal are shown in FIG. 19 for the sake of simplicity. The relationship of the power supply voltages is VDD2>VDD1>VSS.

As the input signal IN, small-amplitude signals such as a signal 1 having a potential of VDD1 at a HIGH level and a potential of VSS at a LOW level, and a signal 2, with a reference voltage Vref as the center, having a potential of (Vref+Vd) at a HIGH level and the potential of (Vref−Vd) at a LOW level can be level shifted (amplified) to a large-amplitude signal having the potential of VDD2 at the HIGH level and the potential of VSS at the LOW level. Further, the input signals 1 and 2 turn on the transistors M21 and M31 that receive the signals when they are at the HIGH level and turn them off when they are at the LOW level. The amplitude of the signal 2 is within the amplitude range of the signal 1, and the reference voltage Vref is set to near the threshold voltage of the transistors M21 and M31 when the amplitude is particularly small.

The operation of the level shift circuit shown in FIG. 1 will be described.

In an initial state, the input signals IN and INB received by the terminals 1 and 2 are at a LOW level and at a HIGH level respectively, and the output signals OUT and OUTB output-ted from the terminals 3 and 4 are at a LOW level (VSS) and at a HIGH level (VDD2) respectively.

Further, in the initial state, since the input signal IN is at the LOW level, the transistor M21 is turned off and the output current Ic of the current generator circuit 210 is cut off in the first current control circuit 200. One end of the resistance R23, the node N1 is at VDD2, the PMOS transistor M24 is turned off, and one end of the resistance R25, the node N2 is at VSS. As a result, the transistor M1 is turned off as well.

Meanwhile, since the output signal OUT is at the LOW level, the transistor M32 is turned off and the output current Id of the current generator circuit 310 is cut off in the second current control circuit 300. One end of the resistance R33, the node N3 is at VDD2, the PMOS transistor M34 is turned off, and one end of the resistance R35, the node N4 is at VSS. As a result, the transistor M2 is turned off as well.

Now, the input signals IN and INB change to a HIGH level and a LOW level, respectively, from this initial state. Immediately after the changes, in the current control circuit 200, the transistor M21 is turned on since the input signal IN is at the HIGH level. Further, since the output signal OUTB is at the HIGH level (VDD2), the transistor M22 is turned on as well. As a result, the current generator circuit 210 generates the output current Ic.

Meanwhile, in the second current control circuit 300, since the input signal INB is at the LOW level and the transistor M31 is turned off, the output current Id remains cut off, and the transistor M2 remains turned off as well.

In the first current control circuit 200, once the output current Ic starts to flow, the voltage across the load resistance R23 increases, the potential of the node N1 is lowered, and the transistor M24 is turned on, generating a current through the load resistance R25.

Furthermore, due to an increase in the voltage across the load resistance R25, the gate-source voltage of the transistor M1 increases, turning it on, and the output signal OUTB at the terminal 4 is lowered to the LOW level (VSS).

Further, since the transistor M3 is turned on immediately after the change, the transistor M1 needs a higher discharging capacity than the charging capacity of the transistor M3.

However, the transistor M1 can easily have a high discharging capacity without having a large size since the gate potential of the transistor M1 can be varied over a range between the low potential power supply voltage VSS and the high potential power supply voltage VDD2.

Once the output signal OUTB at the terminal 4 turns to the LOW level, the transistor M4 is turned on, and the output signal OUT at the terminal 3 is raised to the HIGH level (VDD2), turning off the transistor M3 and completing the level shift operation.

Further, since the transistor M22 in the current generator circuit 210 is turned off when the output signal OUTB changes to the LOW level, the output current Ic is cut off, and the transistor M1 is turned off.

Even when the level of the output signal OUTB is temporarily raised from VSS by noise, the operating reliability is not reduced since the output current Ic is re-generated and lowers the output signal OUTB to the LOW level as long as the input signal IN stays at the HIGH level.

The operation in which the input signal IN changes from the LOW level to the HIGH level has been described above. The second current control circuit 300 operates similarly when the input signal IN changes from a HIGH level to a LOW level.

Figure 22:
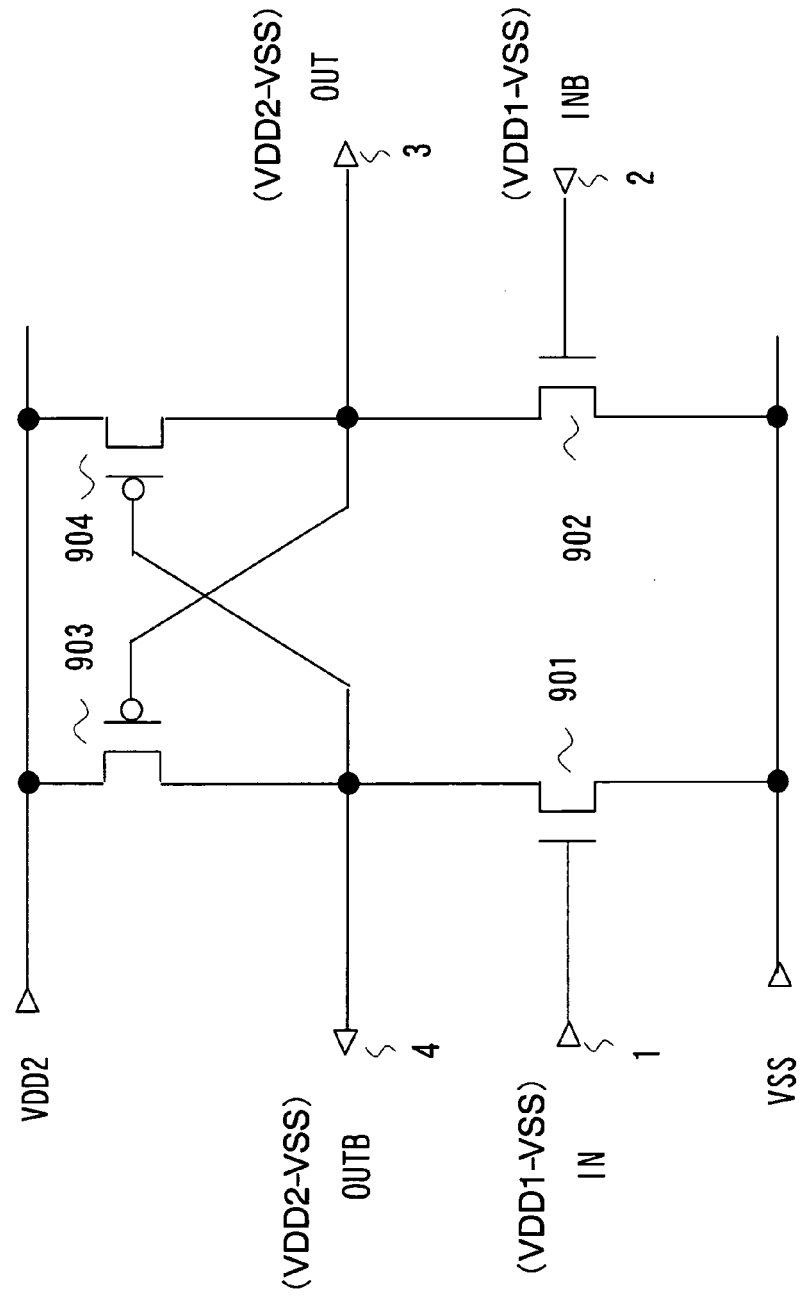
FIG. 22 is a drawing showing a typical configuration of a level shift circuit.
Figure 23:
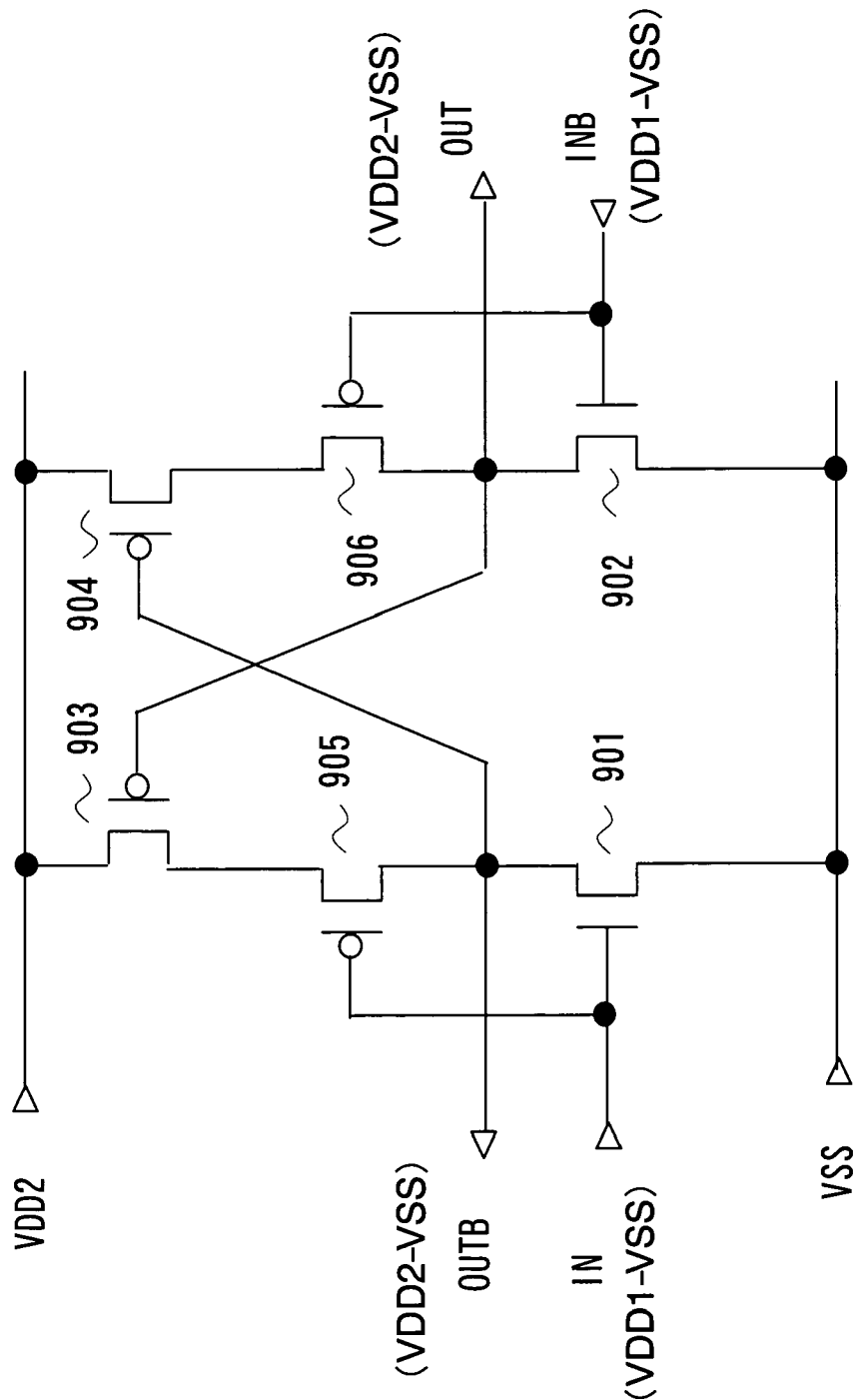
FIG. 23 is a drawing showing the configuration of a level shift circuit having a formulation similar to ones disclosed in Patent Document 1.
Figure 24:
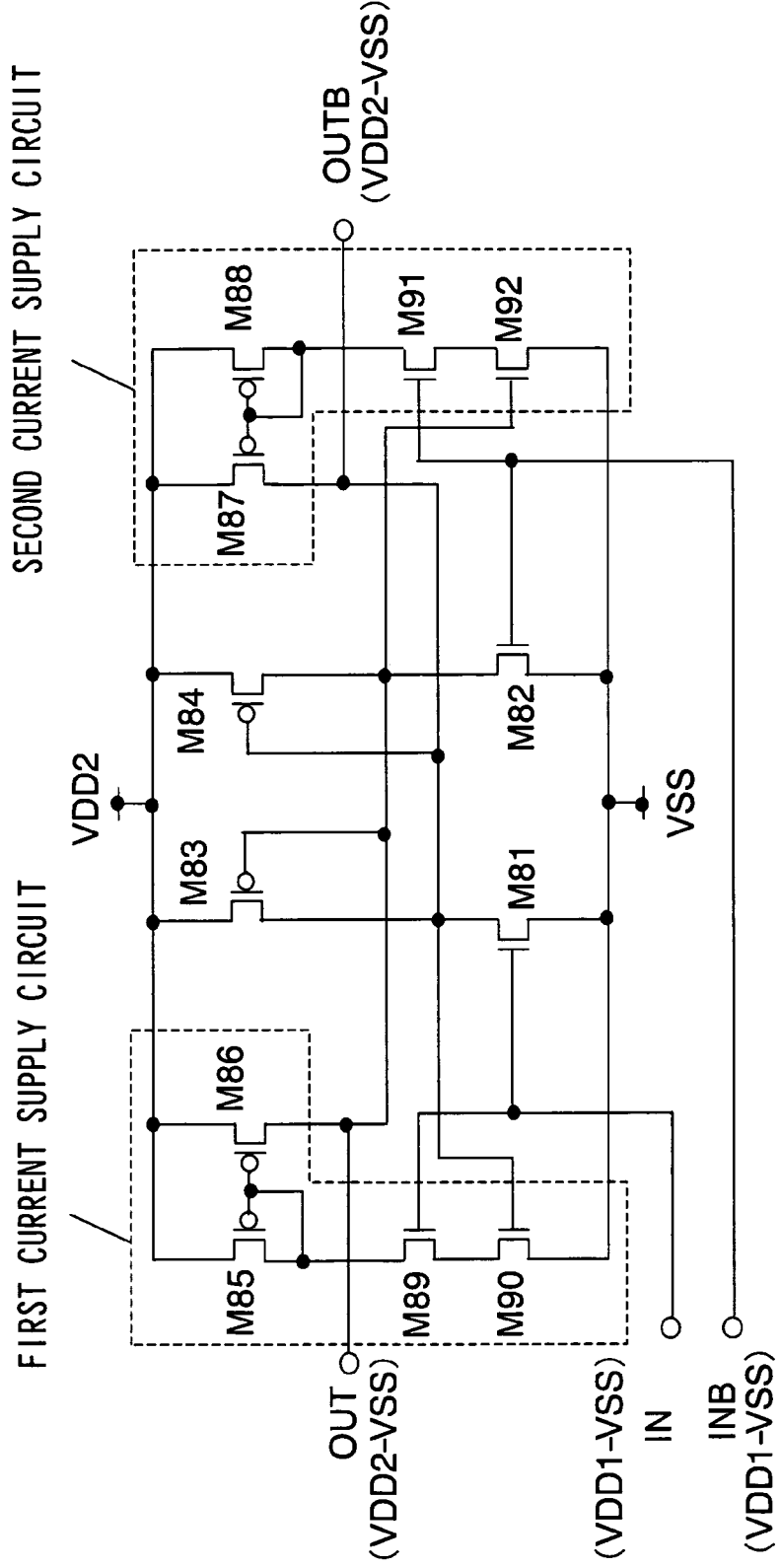
FIG. 24 is a drawing showing the configuration of a level shift circuit having a formulation similar to ones disclosed in Patent Document 2.

In the level shift circuits shown in FIGS. 22, 23, and 24, it is difficult to obtain a sufficient discharging capacity since the upper limit of the gate potential of the transistors 901 and 902 or M81 and M82 that lower the level of the output signals OUTB and OUT is determined by the HIGH level potential (VDD1) of the input signals IN and INB. On the other hand, the level shift circuit shown in FIG. 1 comprises the transistors M1 and M2 having a high discharging capacity, not limited by the HIGH level potential (VDD1) of the input signals IN and INB. In this configuration, the level of the output signals OUT and OUTB is lowered quickly, and as a result, is raised quickly as well. This is one of the advantageous characteristics of the present invention.

Further, in the current generator circuits 210 and 310, although the gate potential of the transistors M21 and M31 suffers restriction by the HIGH level potential (VDD1) of the input signals IN and INB, the output current Ic, being a small current, is increasingly (or step by step) amplified while being converted into currents for the transistor M24 and then the transistor M1 in the first current control circuit 200, and the output current Id, also being a small current, is increasingly amplified while being converted into currents for the transistor M34 and then the transistor M2 in the second current control circuit 300. As a result, the transistor M1 and M2 have a high discharging capacity.

Further, since the first and the second current control circuits 200 and 300 are added to the level shift circuit in FIG. 1, there are more elements, compared to the configurations shown in FIGS. 22 and 23. However, for the level shift circuit in FIG. 1, each transistor does not need to have a very large size and the circuit can be realized with transistors with reasonable sizes. As a result, the buffer circuit that supplies the input signals does not have to have a large size, either.

Further, in FIG. 1, the load resistances R23, R25, R33, and R35 can be replaced with diode-connected transistors or constant current sources.

As described above, the level shift circuit shown in FIG. 1 operates reliably at high speed even when the amplitude of the input signal is small and the amplitude of the output signal is large.

Further, the level shift circuit in FIG. 1 the explanation has been presented in the case where the level shifts from the HIGH level potential to the high voltage side in the level shift between the input signal and the output signal. However, it is possible to realize a level shift circuit for a case where the level shifts from the LOW level potential to the low voltage side. In this case, the polarity of each transistor that constitutes the level shift circuit is reversed.

The above applies to the level shift circuits shown in FIGS. 2 to 7, however, the explanation is given with reference to the configurations of the level shift circuits that level-shift the HIGH level potential to the high voltage side in the level shift between the input signal and the output signal are shown, for the sake of convenience.

Figure 2:
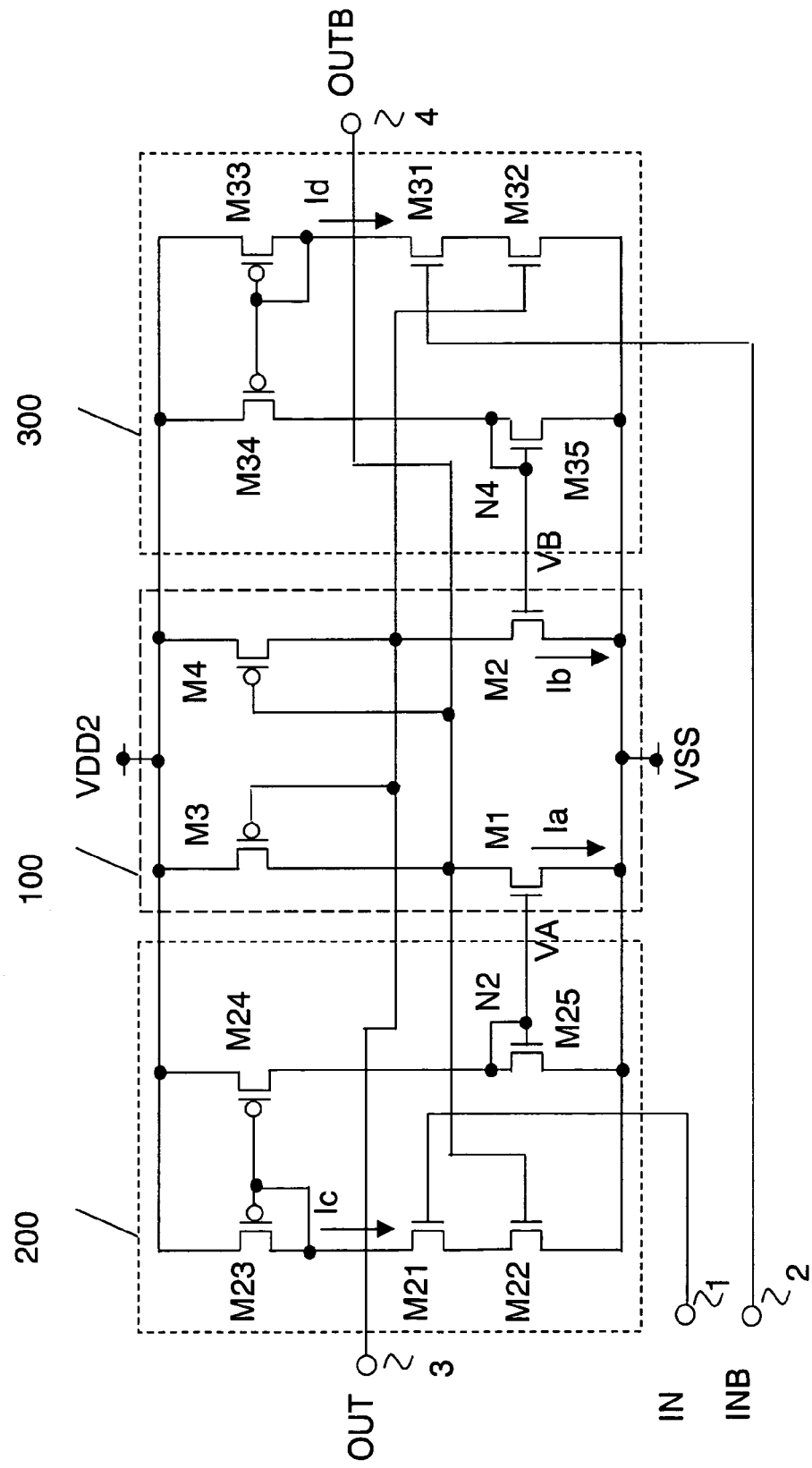
FIG. 2 is a drawing illustrating the configuration of a level shift circuit of a second example of the present invention.

FIG. 2 is a drawing illustrating the configuration of a second example of the present invention. The load resistances R23, R25, R33, and R35 in FIG. 1 are replaced with diode-connected PMOS transistor M23, NMOS transistor M25, PMOS transistor M33, and NMOS transistor M35. The transistors M23 and M24, the transistors M25 and M1, the transistors M33 and M34, and the transistors M35 and M2 function as if they (transistor-pair) constitute a current mirror formulation, respectively, and the amplification ratio between the input current and the output current can be increased according to the setting of the transistor sizes on the input side and the output side. As a result, the currents obtained by amplifying the output currents of the current generator circuits 200 and 300 flow through the transistors M1 and M2, giving the transistors M1 and M2 a high discharging capacity.

Further, only transistors are used to constitute the level shift circuit in the configuration shown in FIG. 2. No external signal is necessary.

Figure 3:
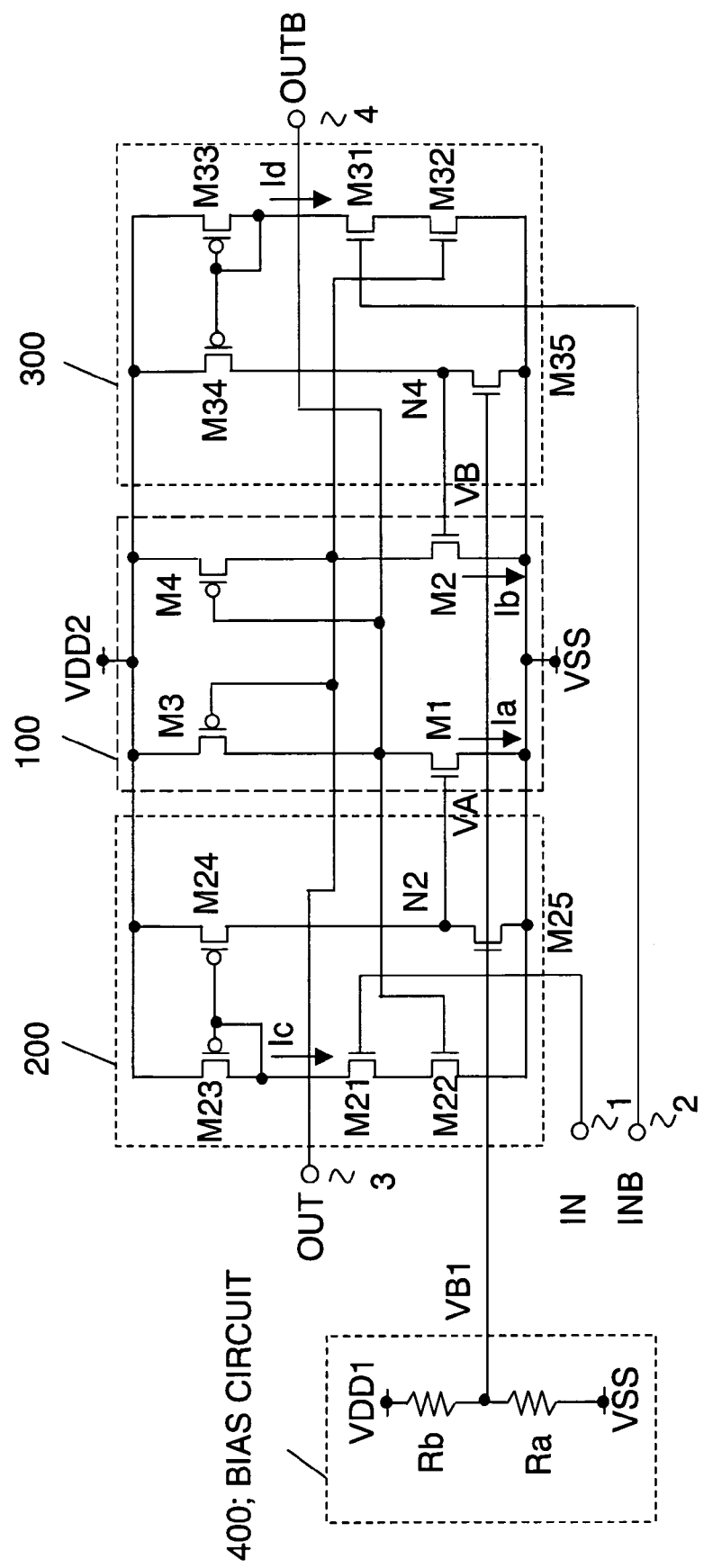
FIG. 3 is a drawing illustrating the configuration of a level shift circuit of a third example of the present invention.

FIG. 3 is a drawing illustrating the configuration of a third example of the present invention. Referring to FIG. 3, out of the load resistances R23, R33, R25, and R35 in FIG. 1, R23 and R33 are replaced with the diode-connected transistors M23 and M33, respectively, and R25 and R35 are replaced with current sources (the transistors M25 and M35 having a bias voltage supplied to the gates), respectively.

The transistors M23 and M24, and the transistors M33 and M34 respectively function as if they constitute a current mirror formulation (transistor pair).

If the current values of the current sources M25 and M35 are made sufficiently small, the fluctuation range of the gate potential of the transistors M1 and M2 will increase, raising the current drive capability (discharging capacity) of the transistors M1 and M2.

Further, after the gate potentials of the transistors M1 and M2 are temporarily raised by each operation of the first and the second current control circuits 200 and 300, they are lowered to the low potential power supply voltage VSS at a speed corresponding to the current value of the current sources M25 and M35. When the current value of the current sources M25 and M35 is sufficiently small, the time it takes to reach the low potential power supply voltage VSS becomes relaxed (change becomes slow), and the voltage holding capability becomes high since the transistors M1 and M2 are turned on during that time. However, it is preferred that the current value is set so that the gate potentials of the transistors M1 and M2 return to the low potential power supply voltage VSS within one output period.

The bias voltage VB1 is supplied by the bias circuit 400 since the current sources M25 and M35 require a bias voltage (FIG. 3).

The bias voltage VB1 can be generated by, for instance, resistance division between the low potential power supply voltage VSS and the power supply VDD1 (voltage dividing resistances Ra and Rb).

Further, the PMOS transistors M23 and M33 may be replaced with current sources. In this case, more bias voltages are required. A bias circuit generating these bias voltages might require a bigger power consumption than the bias circuit 400 in case where the bias voltages are generated by resistance division between the power supply VDD1 and the high potential power supply voltage VDD2, if the potential difference between the two power supplies (VDD2−VDD1) is bigger than (VDD1−VSS).

Figure 4:
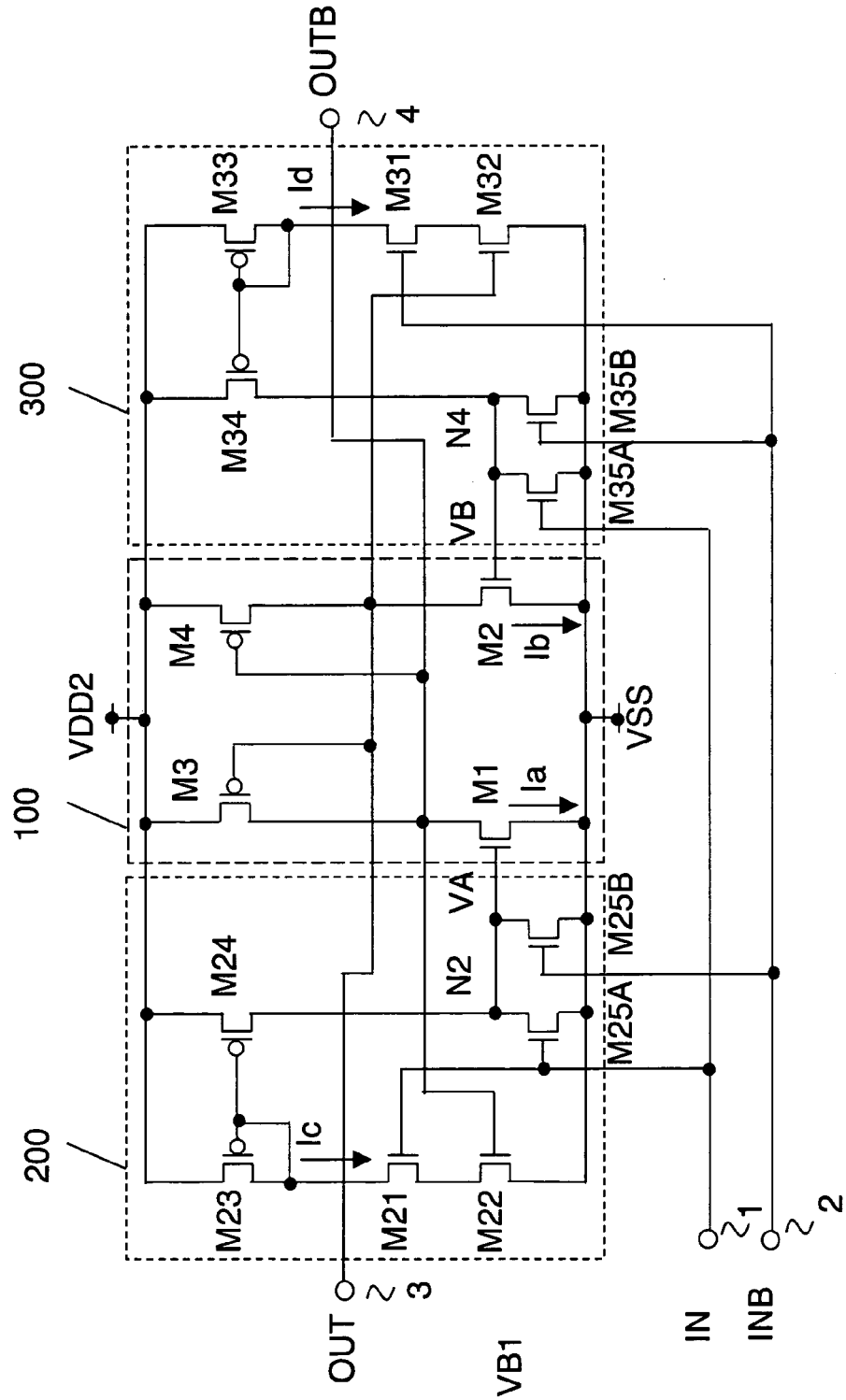
FIG. 4 is a drawing illustrating the configuration of a level shift circuit of a fourth example of the present invention.

FIG. 4 is a drawing illustrating the configuration of a fourth example of the present invention, and the circuit shown in FIG. 3 is realized without using any bias circuit in FIG. 4. The transistors M25 and M35 in FIG. 3 are replaced with the transistor pairs (M25A and M25B) and (M35A and M35B) receiving the input signals IN and INB at the respective gate.

Since one of the input signals IN or INB is always at a HIGH level, the same functions as current sources can be realized by optimally setting the size (W/L ratio) of each transistor pair (M25A and M25B) and (M35A and M35B).

Figure 16:
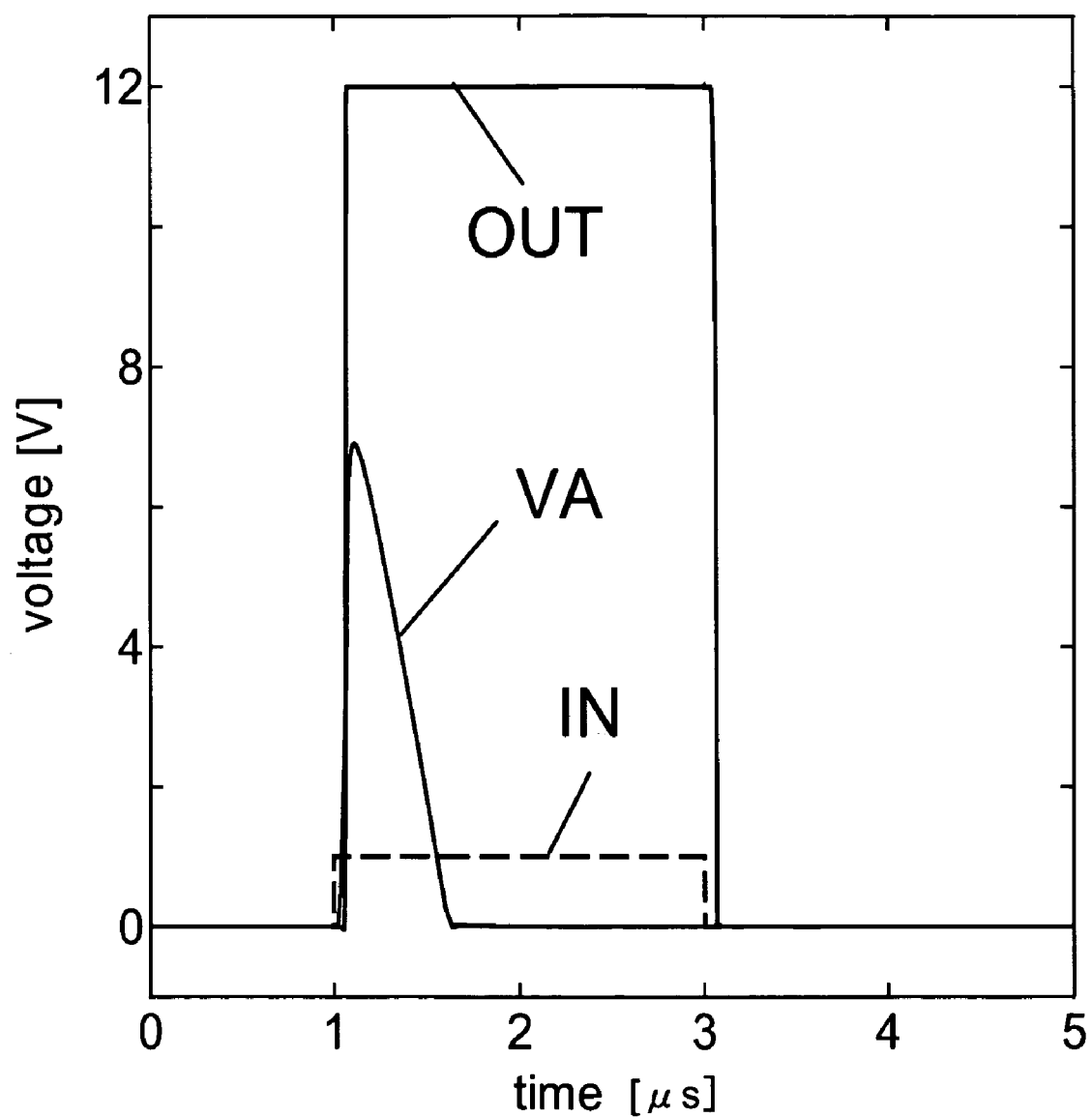
FIG. 16 is a graph showing signal voltage waveforms for explaining the operation of the example shown in FIG. 3.

FIG. 16 is a drawing showing the results of operation simulation of the circuit shown in FIG. 3, and it shows the voltage waveforms of the input signal IN, the output signal OUT, and a gate terminal voltage VA of the transistor M1. In order to illustrate the differences from the results shown in FIG. 25, the voltage conditions and the input signal are identical.

FIG. 16 shows that there is no delay in the voltage change (transition) of the output signal OUT and that a high-speed operation is possible.

The waveform of the voltage VA is instantly raised to a voltage higher than the power supply VDD1 by the first current control circuit 200 when the input signal IN changes from a LOW level (VSS=0V) to a HIGH level (VDD=1V). The transistor M1 quickly lowers the output signal OUTB to the LOW level (VSS) with its high discharging capacity, and as a result, the output voltage OUT is quickly raised to a HIGH level (VDD2).

When the output signal OUTB changes to the LOW level, the transistor M22 is turned off, and the first current control circuit 200 stops operating (assumes a non-operating state). For this reason, the voltage VA drops at a speed corresponding to the discharging capacity (current value) of the current source M23.

Figure 25:
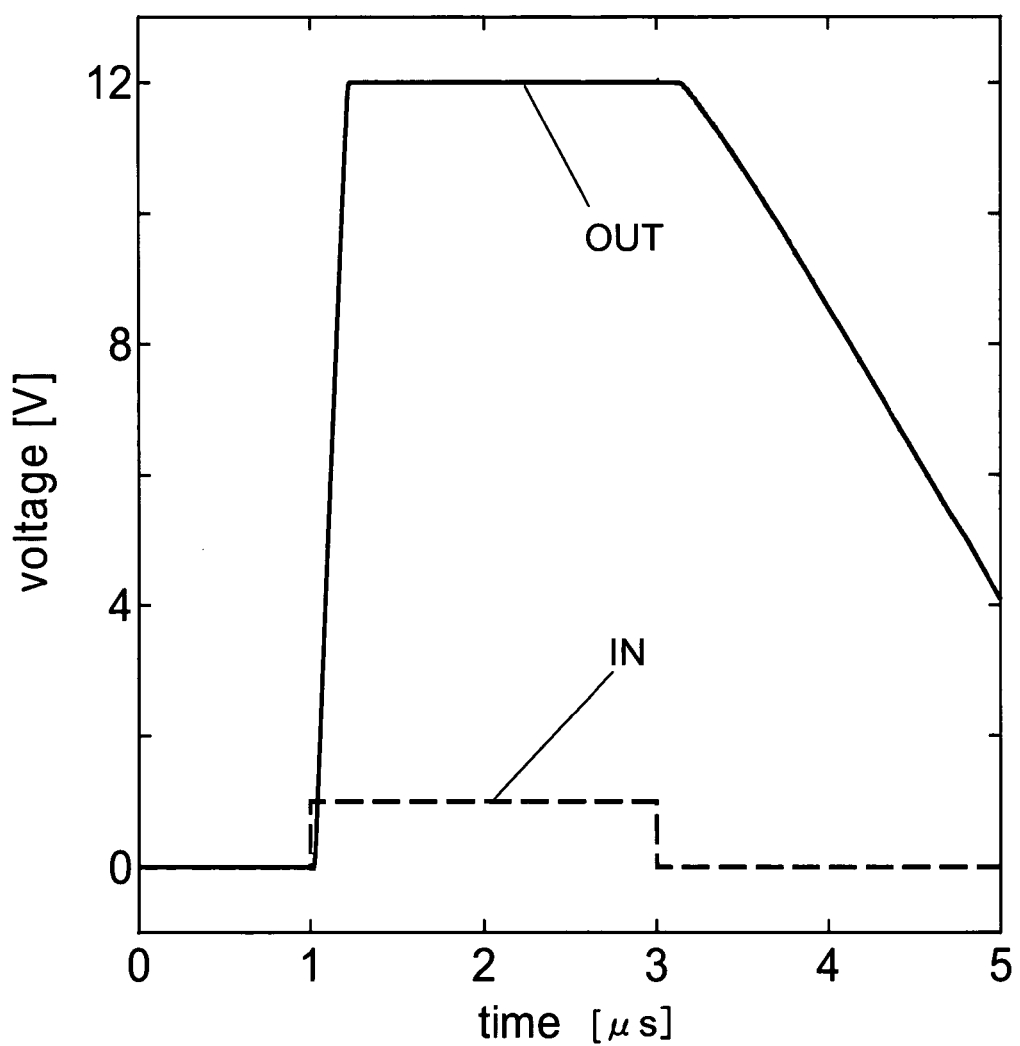
FIG. 25 is a drawing showing input/output waveforms of the circuit shown in FIG. 24, analyzed by the present inventor.

When the input signal IN changes from the HIGH level to the LOW level, the output waveform OUT changes at high speed (for the falling blank), unlike the output waveform shown in FIG. 25.

This is because the gate potential of the transistor M2 is instantly raised to a voltage higher than the power supply VDD1 by the second current control circuit 300 at this time.

Figure 5:
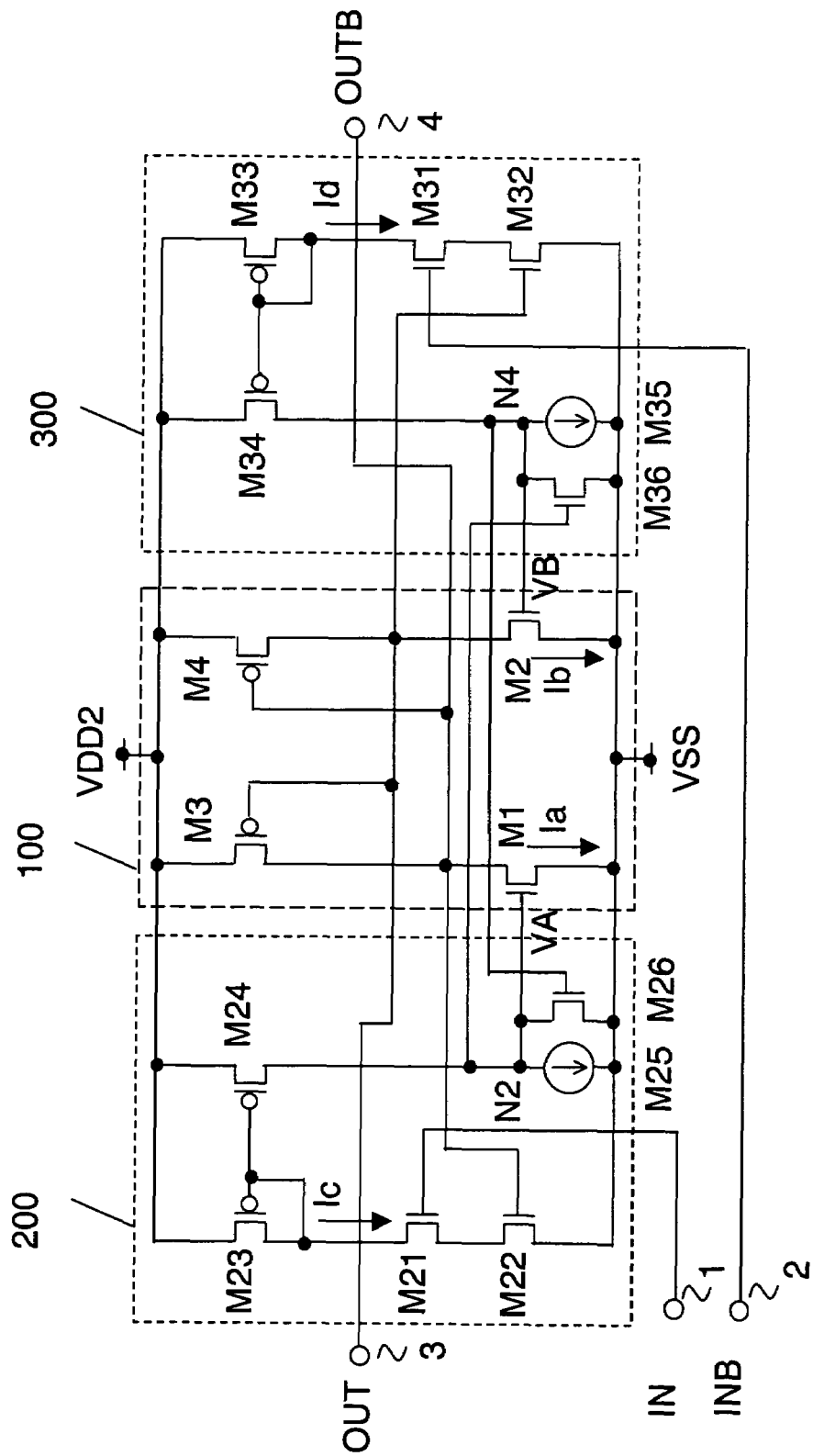
FIG. 5 is a drawing illustrating the configuration of a level shift circuit of a fifth example of the present invention.

FIG. 5 are drawings illustrating the configuration of a fifth example of the present invention. The level shift circuit shown in FIG. 5 is suitable for the case where a data period of the input signal is short, and it comprises the switching transistors M26 and M36 that short-circuit between the gate and the source of each of the transistors M1 and M2.

The switching transistor M26 is connected in parallel with the current source M25 between VSS and the gate of the transistor M1 (node N2), and its gate (of M26) is commonly connected to the gate of the transistor M2 (via node N4). When INB changes from a LOW level to a HIGH level, i.e., when the second current control circuit 300 starts to operate and raises the gate potential of the transistor M2, the switching transistor M26 is turned on and functions so that the gate potential of the transistor M1 is at VSS. In other words, the switching transistor M26 accelerates the turn-off of the transistor M1 so that the transistor M1 does not interfere with the level shift operation during the operation of the second current control circuit 300.

The switching transistor M36 is connected in parallel with the current source M35 between VSS and the gate of the transistor M2 (node N4), and its gate (of M36) is commonly connected to the gate of the transistor M1. When IN changes from a LOW level to a HIGH level, i.e., when the first current control circuit 200 starts to operate and raises the gate potential of the transistor M1, the switching transistor M36 is turned on and functions so that the gate potential of the transistor M2 quickly reaches VSS. In other words, the switching transistor M36 accelerates the turn-off of the transistor M2 so that the transistor M2 does not interfere with the level shift operation during the operation of the first current control circuit 200.

In the configuration shown in FIG. 3, in order to increase the current drive capability (discharging capacity) of the transistors M1 and M2, the current value of the current sources M25 and M35 should be sufficiently suppressed.

Figure 17:
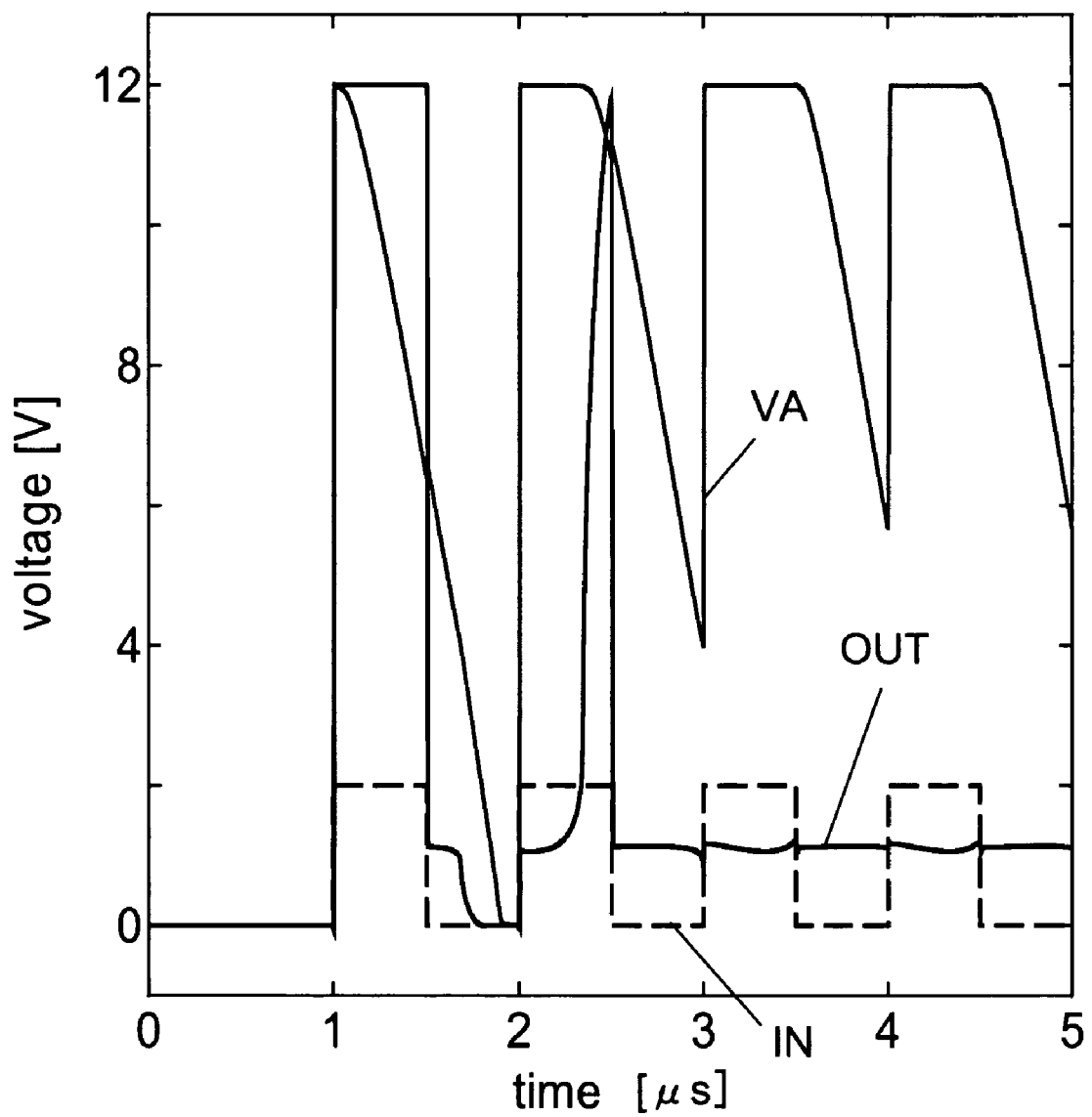
FIG. 17 is another graph showing signal voltage waveforms for explaining the operation of the third example shown in FIG. 3.

However, when the data period of the input signal is short, an error operation might occur. FIG. 17 shows the results of operation simulation of the level shift circuit shown in FIG. 3 when one data period of the input signal is shorter than the case in FIG. 16.

In FIG. 17, the amplitude of the input signal is made larger (the HIGH level potential is 2V) than the case shown in FIG. 16 for the sake of convenience. The current value of the current sources M25 and M35 is the same as FIG. 16. In this case, the voltage VA (the gate potential of the transistor M1) is boosted more than FIG. 16 and the voltage variation range is wider. The same result can be achieved by reducing the current value of the current sources M25 and M35 without changing the amplitude of the input signal.

In the example shown in FIG. 17, the gate voltage VA of the transistor M1 does not completely return to VSS during the first data period when the input signal IN is at the HIGH level because the data period is shortened. As a result, the transistor M1 stays on when the input signal IN changes to the LOW level and the second current control circuit 300 starts to operate in the next data period. This prevents the output signal OUTB from changing from a LOW level to a HIGH level and causes an error operation. Furthermore, in the following data period, the transistor M2 stays on when the input signal IN changes to the HIGH level and the first current control circuit 200 starts to operate. This prevents the output signal OUT from changing from the LOW level to the HIGH level and causes an error operation.

Figure 18:
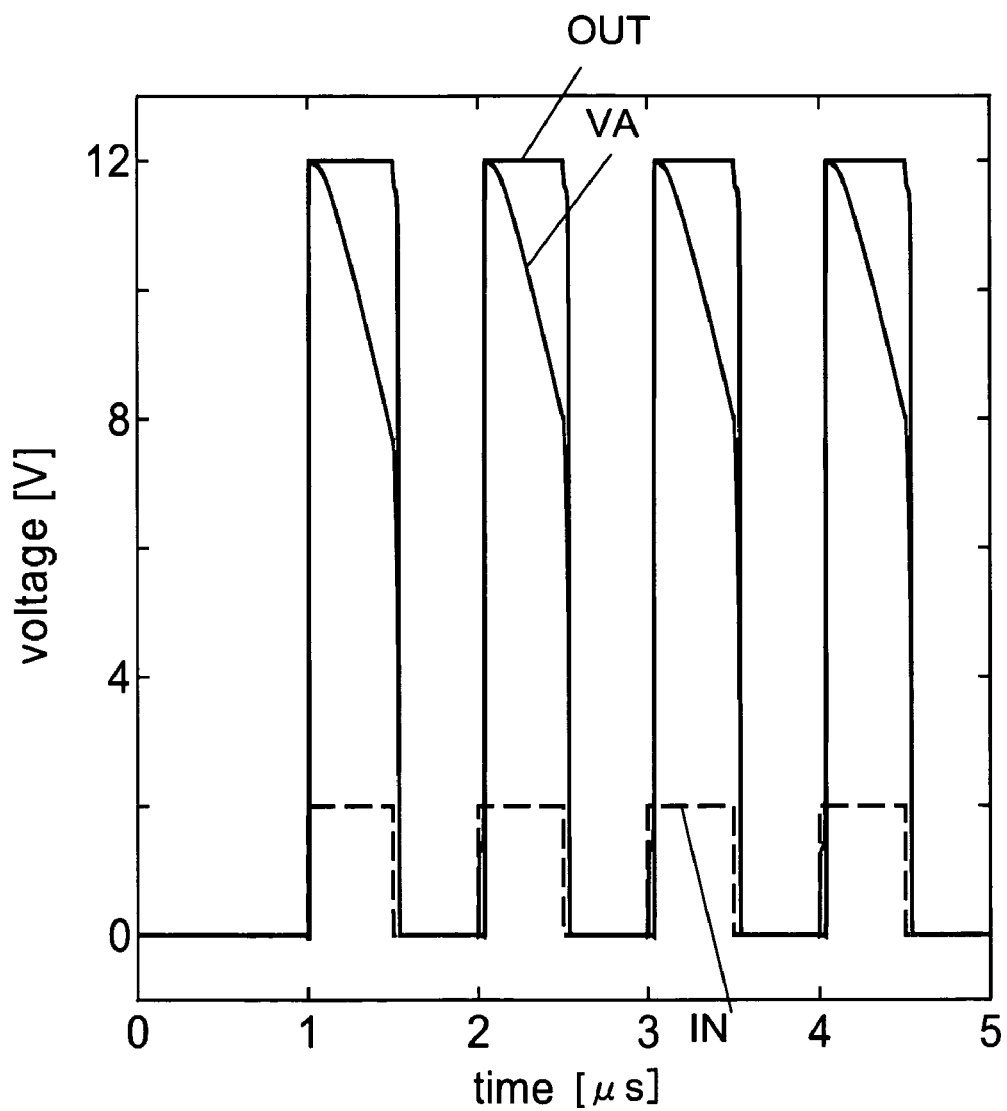
FIG. 18 is a graph showing signal voltage waveforms for explaining the operation of the example shown in FIG. 5.

FIG. 18 shows the results of operation simulation of the level shift circuit shown in FIG. 5 when one data period of the input signal is the same as the case in FIG. 17.

In FIG. 18, even in the case where the gate potential VA of the transistor M1 does not completely return to VSS during a data period when the input signal IN is at the HIGH level, when the input signal IN changes to the LOW level and the second current control circuit 300 starts to operate in the next data period, the transistor M26 is turned on, instantly lowering the gate potential VA of the transistor M1 to VSS and turning off the transistor M1. Further, when the input signal IN changes to the HIGH level in the ensuing data period, the transistor M36 is turned on, instantly lowering the gate potential of the transistor M2 to VSS and turning off the transistor M2. As a result, error operations can be prevented.

Figure 6:
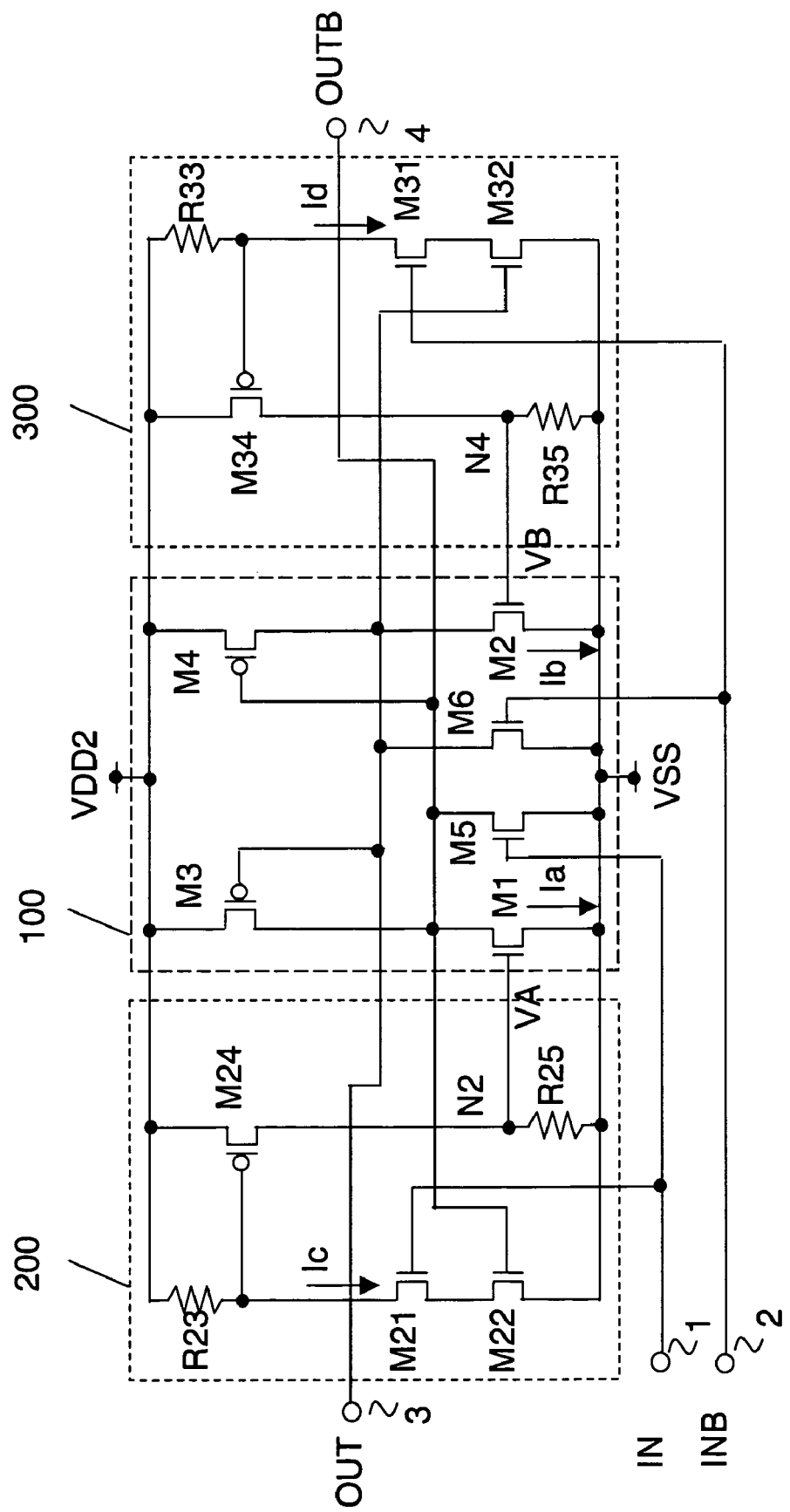
FIG. 6 is a drawing illustrating the configuration of a level shift circuit of a sixth example of the present invention.

FIG. 6 is a drawing illustrating the configuration of a sixth example of the present invention. Referring to FIG. 6, this level shift circuit comprises the NMOS transistors M5 and M6, receiving the input signals IN and INB at the respective gate, between the output terminals 4 and 3 that output the output signals OUTB and OUT and the low potential power supply VSS in addition to the configuration shown in FIG. 1. The level shift circuits shown in FIGS. 2 to 5 may comprise the NMOS transistors M5 and M6 as well.

The transistors M5 and M6 are elements provided to reliably hold the potentials of the output signals OUTB and OUT at VSS when each signal is at a LOW level. As described in the case of FIG. 1, in the level shift circuit shown in FIG. 1, the transistors M1 and M2 are turned off once they respectively lower OUTB and OUT to the LOW level. At this time, the potential of OUTB and OUT is held at the LOW level due to the parasitic capacitance of the elements. Therefore, the level of the output signals might fluctuate because of noise. However, even when the output signals temporarily rise from the LOW level due to noise, they are instantly lowered to the LOW level again by the operation of the first and the second current control circuits 200 and 300. Therefore, there is no problem in practical use even without the transistors M5 and M6.

However, when it is desirable to hold the level of the output signal more reliably, the fluctuations in the level of the output signal caused by noise can be suppressed by providing the transistors M5 and M6 as shown in FIG. 6. In other words, OUTB and OUT can be stably held at the LOW level (VSS) by the transistors M5 and M6 which turn on after OUTB and OUT change to the LOW level by the respective operation of the first and the second current control circuit 200 and 300 when IN and INB are at a HIGH level.

Figure 7:
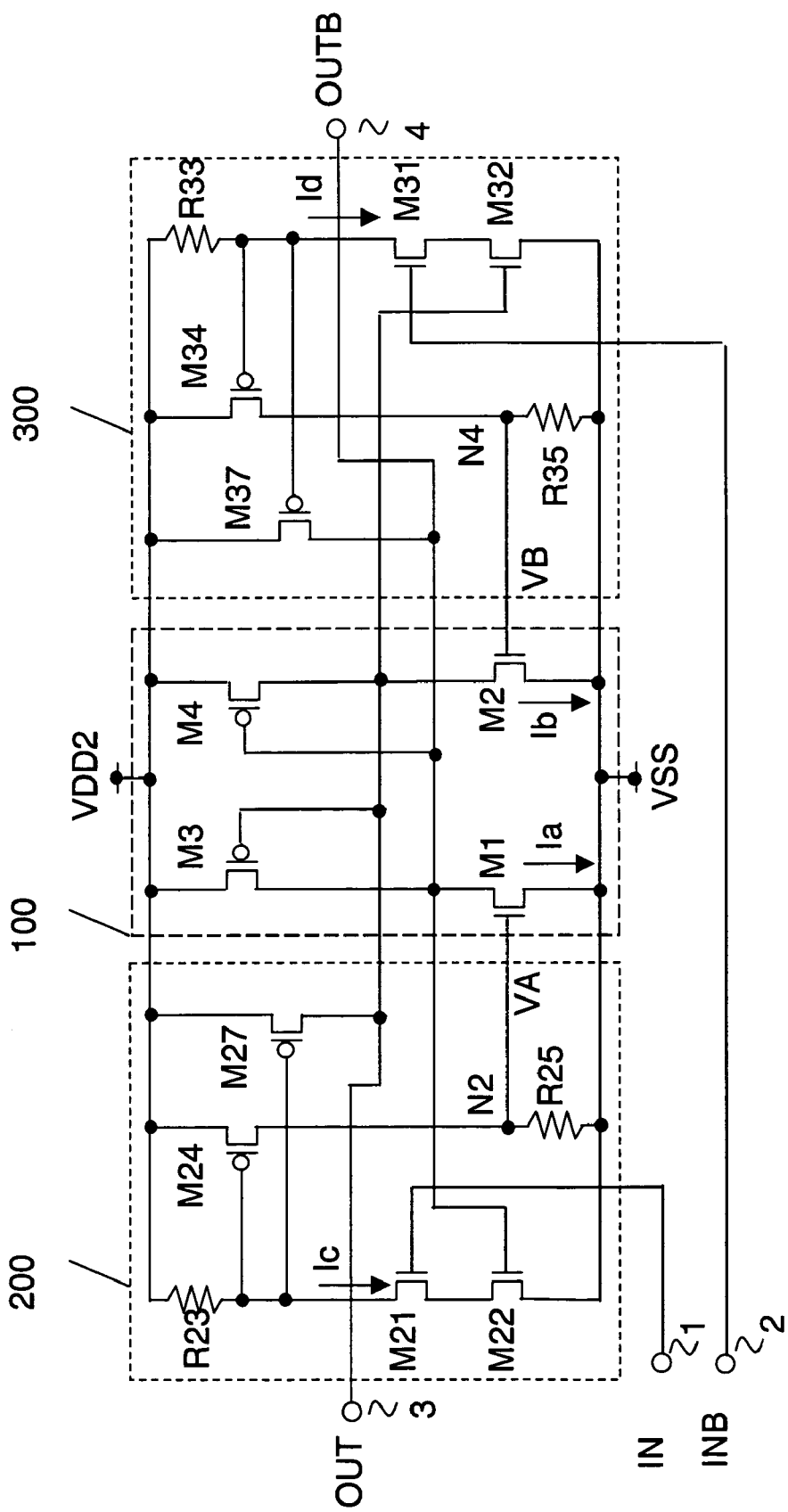
FIG. 7 is a drawing illustrating the configuration of a level shift circuit of a seventh example of the present invention.

FIG. 7 is a drawing illustrating the configuration of a seventh example of the present invention. Referring to FIG. 7, in a level shift circuit of the present example, the first current control circuit 200 further comprises the PMOS transistor M27 having the source connected to the power supply VDD2, the gate connected to the node N1 (the connection node between the resistance R23 and the drain of the transistor M21), and the drain connected to the output terminal 3, in addition to the configuration in FIG. 1. Meanwhile, the second current control circuit 300 further comprises the PMOS transistor M37 having the source connected to the power supply VDD2, the gate connected to the node N3 (the connection node between the resistance R33 and the drain of the transistor M31), and the drain connected to the output terminal 4. The functions of the transistors M27 and M37 are the same as those of the transistors M86 and M87 in FIG. 24.

In the operation of the level shift circuit shown in FIG. 1, the transistor M1 is turned on and the level of the output signal OUTB is lowered when the input signals IN and INB change to the HIGH level and the LOW level, respectively, from the initial state. The level of the output signal OUT starts to be raised when the level of the output signal OUTB has been lowered to a certain extent.

On the other hand, in the configuration shown in FIG. 7, when the input signal IN changes to the HIGH level, the transistor M21 is turned on (M22 is on at this time), so is the transistor M24, the transistor M1, having the terminal voltage of the resistance R25 as the gate potential, is turned on, and the output OUTB starts to be pulled down from the HIGH level to the LOW level. At this time, the transistor M27 is turned on as well, and the pull-up operation of the output signal OUT is performed at the same time as the pull-down operation of the output signal OUTB.

Therefore, the level change of the output signals is speedier, and the through current is less likely to occur when the level of the output signals changes, compared to the configuration in FIG. 1.

The transistor M37 performs the pull-up operation of OUTB to the HIGH level similarly to the transistor M27 when the input signals IN and INB change to the LOW level and the HIGH level, respectively.

Figure 8:
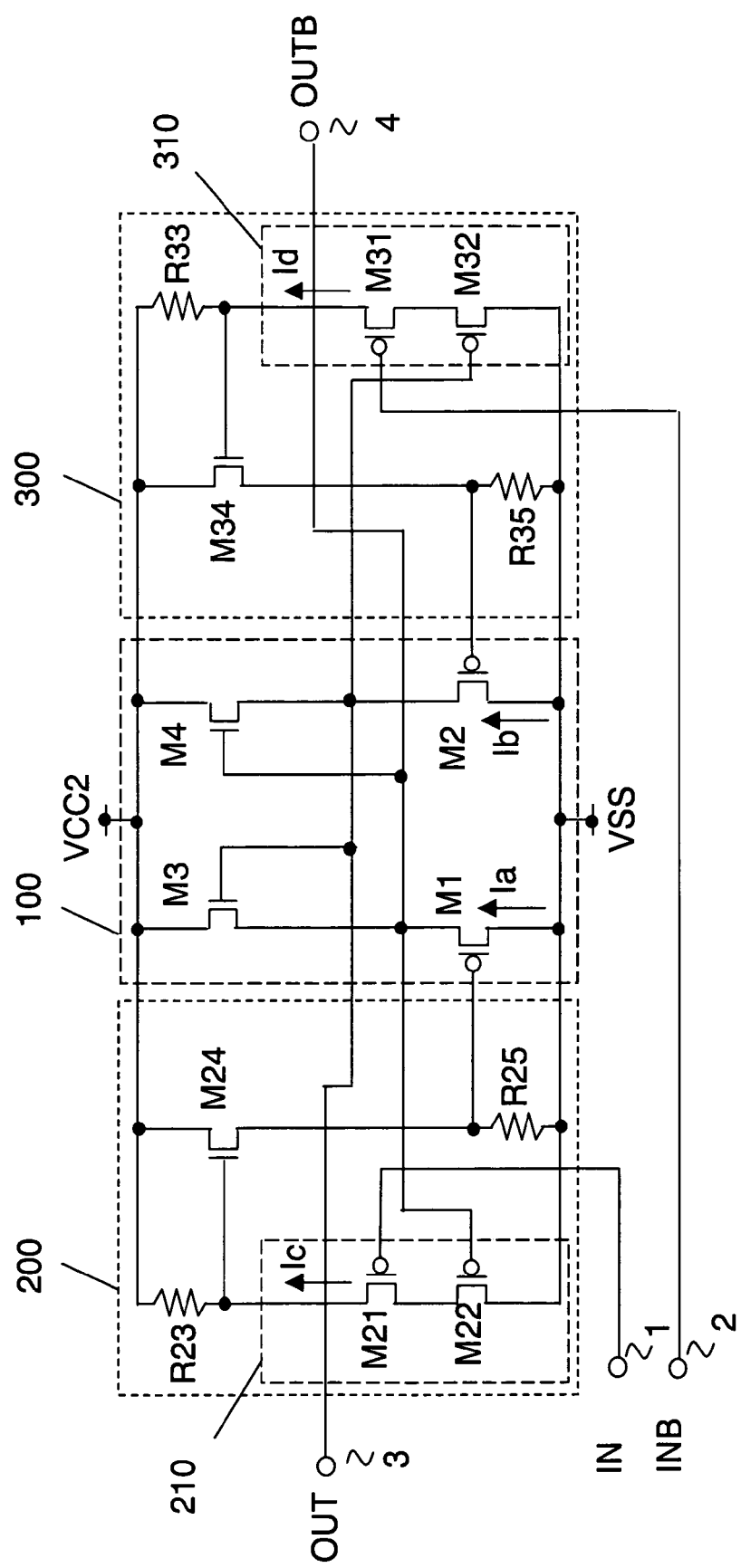
FIG. 8 is a drawing illustrating the configuration of a level shift circuit of an eighth example of the present invention.
Figure 20:
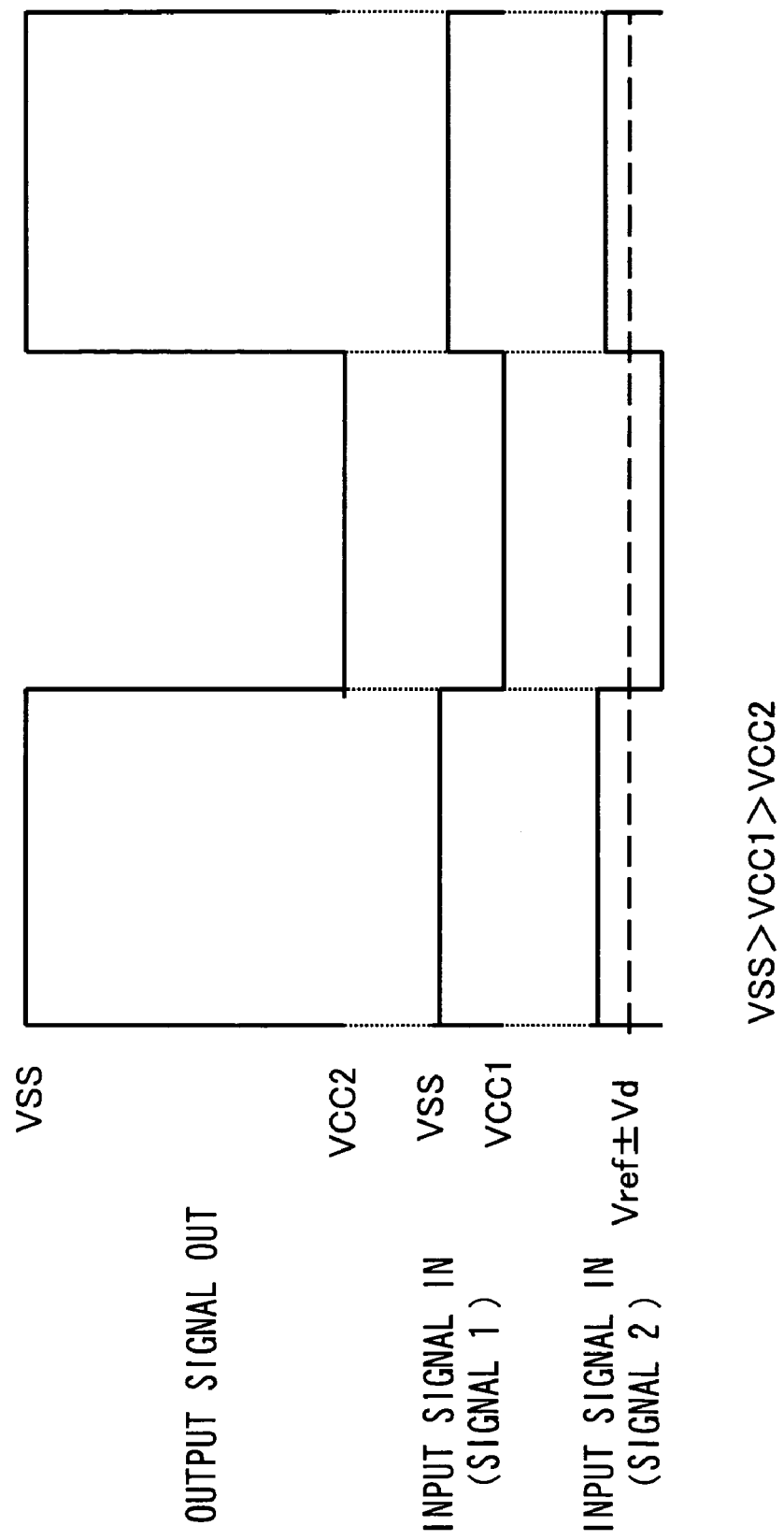
FIG. 20 is a drawing showing input/output waveforms of the circuit shown in FIG. 8.

FIG. 8 is a drawing illustrating the configuration of an eighth example of the present invention. FIG. 20 shows timing waveforms illustrating the operation of the level shift circuit in FIG. 8. The level shift circuit in FIG. 8 level shifts a LOW level potential to a low voltage side in the level shift between the input signal and the output signal as shown in FIG. 20. The relationship of the power supply voltages is VSS>VCC1>VCC2. As the input signal IN, small-amplitude signals such as a signal 1 having the potential of VSS at a HIGH level and the potential of VCC1 at a LOW level, and a signal 2, with a reference voltage Vref as the center, having the potential of (Vref+Vd) at a HIGH level and the potential of (Vref−Vd) at a LOW level can be level shifted to a large-amplitude signal having the potential of VSS at a HIGH level and the potential of VCC2 at a LOW level. Further, the input signals 1 and 2 turn on the transistors M21 and M31 that receive the signals when they are at the LOW level and turn them off when they are at the HIGH level. The amplitude of the signal 2 is within the amplitude range of the signal 1, and the reference voltage Vref is set to near the threshold voltage of the transistors M21 and M31 when the amplitude is particularly small.

The configuration in FIG. 8 can be achieved by changing the polarity of the transistors and inverting the potential levels of the power supply voltages in FIG. 1. In FIG. 8, the high potential power supply voltage is VSS, and the low potential power supply voltage is VCC2. Further, in FIG. 8, the N-channel transistors M1, M2, M21, M22, M31, and M32 in FIG. 1 become P-channel transistors, and the P-channel transistors M3, M4, M24, and M34 in FIG. 1 become N-channel transistors. Note that the element numbers are the same as FIG. 1. The configurations in FIGS. 2 to 7 can be changed to level shift circuits that level-shift to the low potential side by changing the polarity of the transistors and inverting the power supply voltage levels, as in the case with FIGS. 1 and 8.

Figure 9:
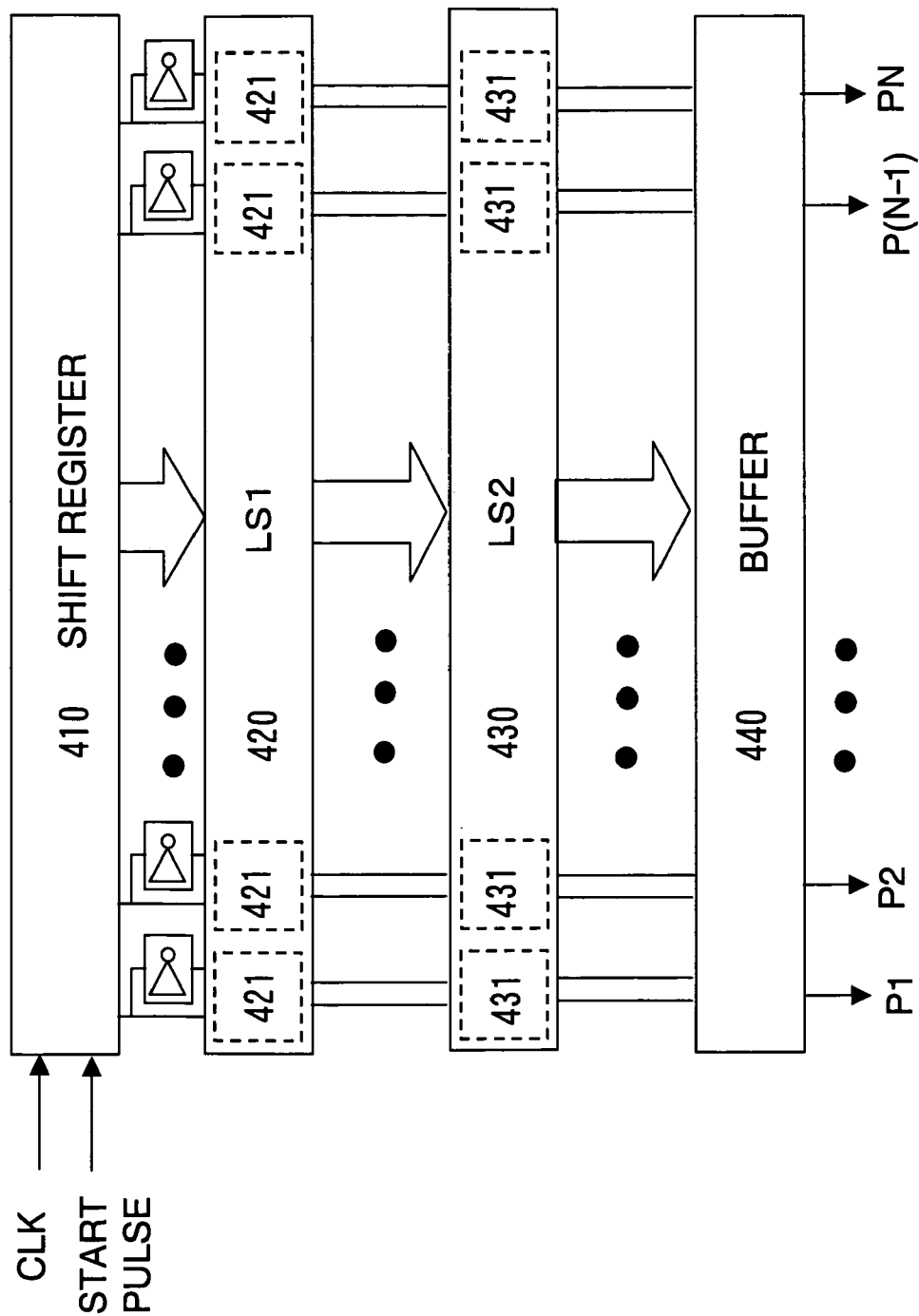
FIG. 9 is a drawing illustrating the configuration of a gate driver of a ninth example of the present invention.
Figure 10:
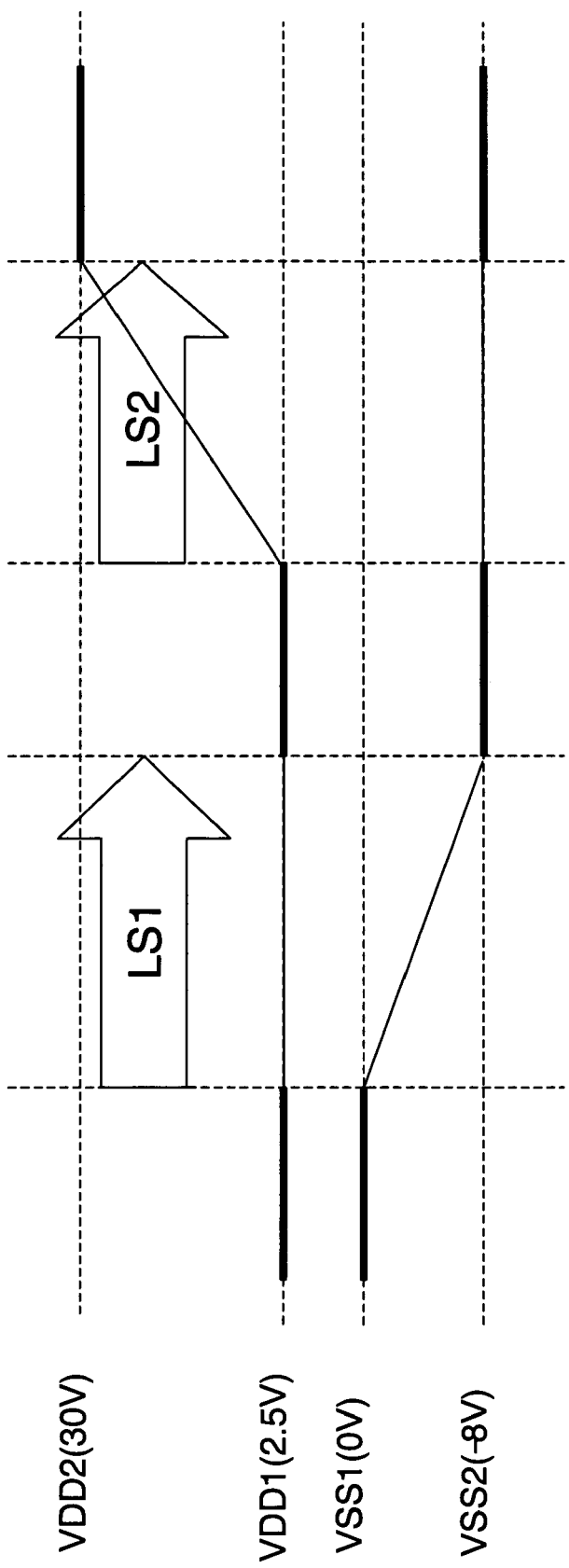
FIG. 10 is a drawing schematically showing how the signal voltage amplitudes change in the gate driver of the ninth example of the present invention.
Figure 21:
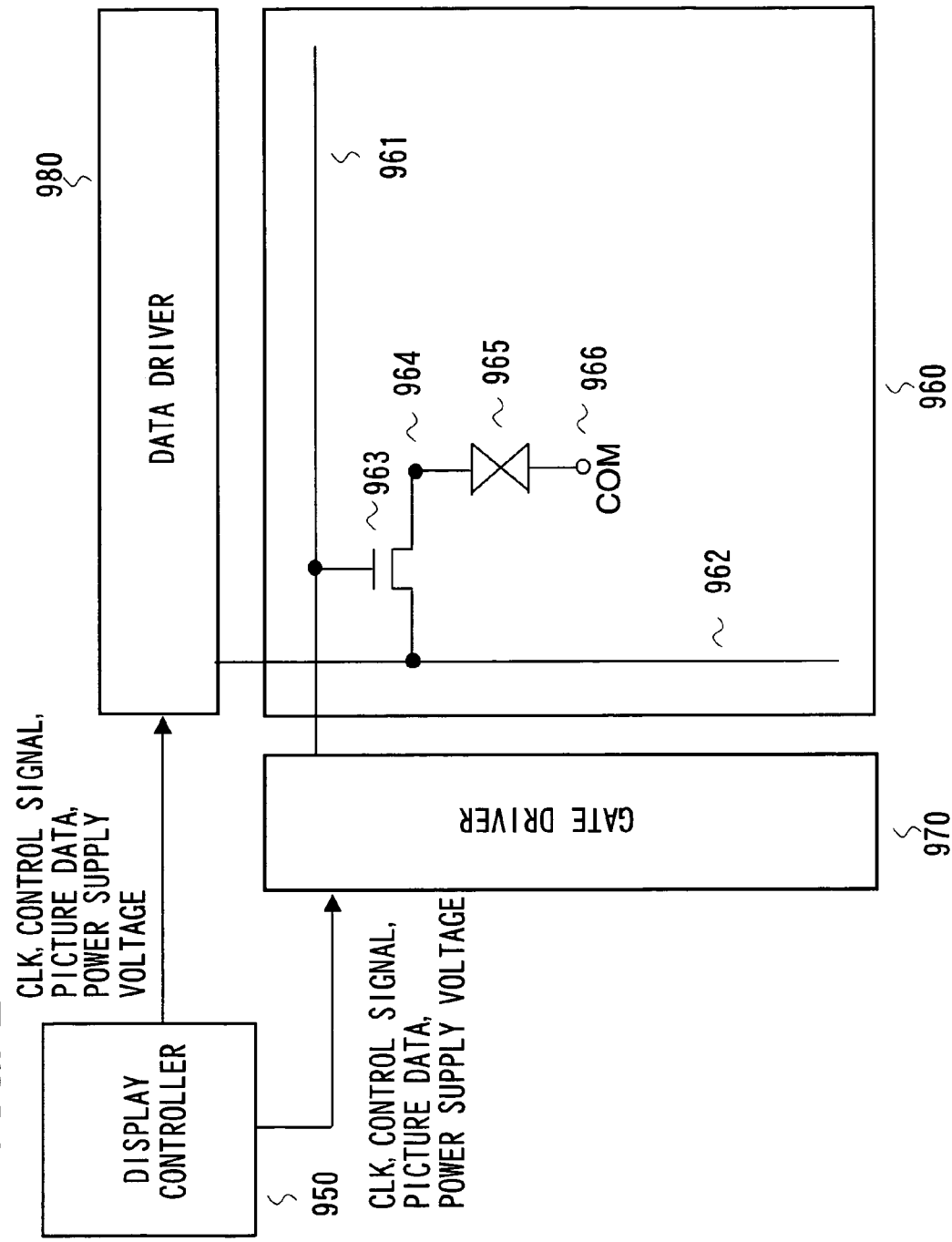
FIG. 21 is a drawing schematically showing the configuration of a display device.

FIG. 9 is a drawing illustrating the configuration of a ninth example of the present invention, and the configuration of the gate driver 970 of the LCD device in FIG. 21 comprising the level shift circuits of the present invention is shown. FIG. 10 is a drawing schematically showing how the signal voltage amplitudes change in the configuration shown in FIG. 9.

Referring to FIG. 9, the gate driver comprises a level shift circuit group (LS1) 420 and a level shift circuit group (LS2) 430. A shift register 410 receives a CLK and a start pulse. The start pulses sampled every CLK cycle are data shifted one after another, and scanning signals are outputted one after another from a buffer 440 via LS1 and LS2. The LS1 is a level shift circuit group that level-shifts to the low potential side. The level shift circuit group LS2 level-shifts a signal level shifted by LS1 to the high voltage side. LS1 receives signals having an amplitude VDD1 (2.5V) and an amplitude VSS (0V) from the shift register 410, and outputs output signals having the amplitude VDD1 (2.5V) and an amplitude VSS2 (−8V). LS2 receives the signals having the amplitude VDD1 (2.5V) and the amplitude VSS2 (−8V), outputs signals having an amplitude VDD2 (30V) and the amplitude VSS2 (−8V), and supplies them to the buffer 440. The buffer 440 receives the output signals from LS2 and drives the scanning lines of the display device.

In the level shift circuits applied to the gate driver of the LCD device, the amplitude of the output signal is very large compared to the amplitude of the input signal, and the voltage of the output signal must change at high speed. This is because the application of the grayscale (gradation) voltage to the pixel electrodes is delayed when the scanning signal changes to a HIGH level and there is delay in the voltage change of the scanning signal outputted from the gate driver according the output signal of the level shift circuit. Further, when the scanning signal changes to a LOW level, excessive charges are supplied to the pixel electrodes by the data lines while the voltage change of the scanning signal is delayed and the potential difference between each pixel electrode and the electrode of the counter-substrate is varied since the potential of the pixel electrodes fluctuates via the parasitic capacitance of TFTs. This results in degradation in the picture quality of the LCD device. Therefore, by using the gate driver comprising the level shift circuits of the present invention, the delay in the voltage change of the scanning signal is suppressed, and an LCD device having high picture quality can be realized.

Figure 11:
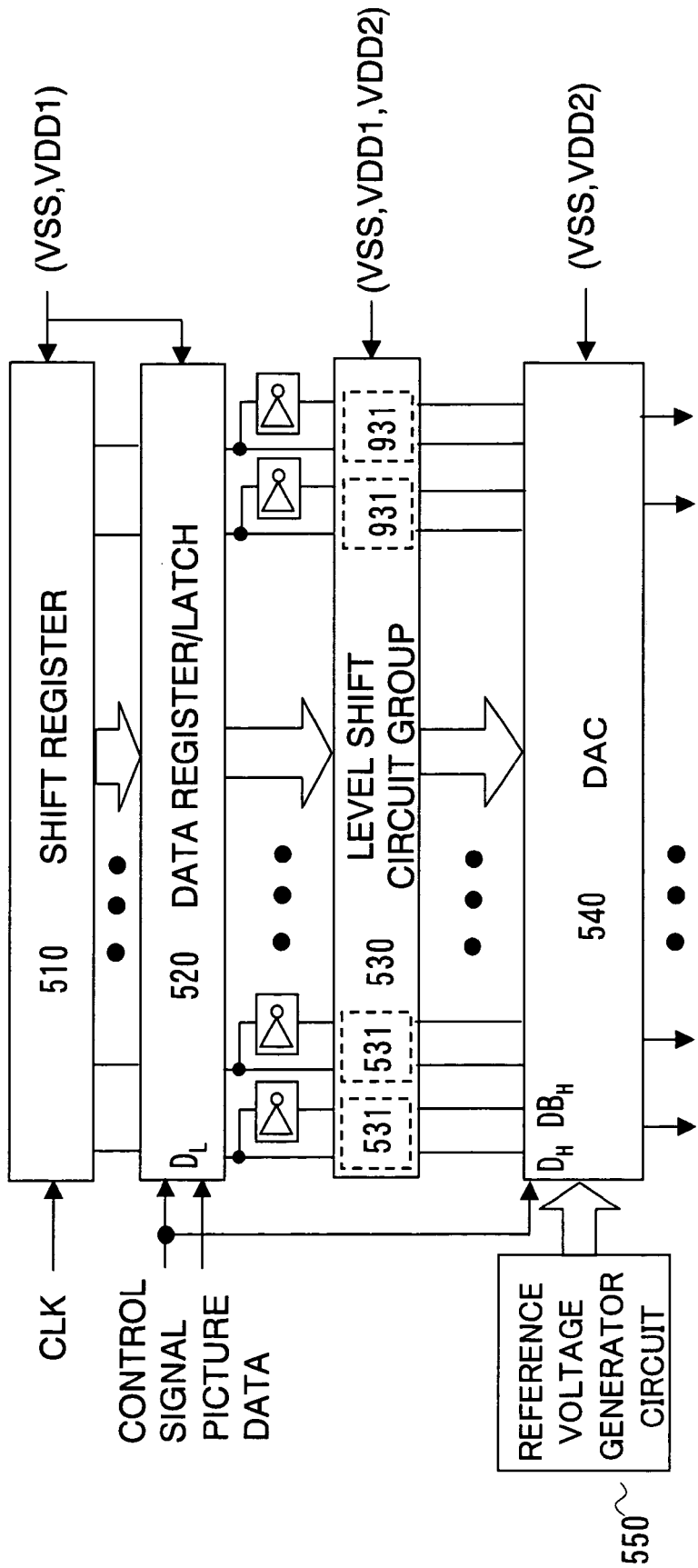
FIG. 11 is a drawing illustrating the configuration of a data driver of a tenth example of the present invention.

FIG. 11 is a drawing illustrating the configuration of a tenth example of the present invention, and the configuration of the data driver 980 of the LCD device in FIG. 21 comprising the level shift circuits of the present invention is shown. FIG. 11 is a block diagram showing main components of the data driver. Referring to FIG. 11, the data driver comprises a shift register 510, a data register/latch 520, a level shift circuit group 530, a digital-to-analog converter 540, and a reference voltage generator circuit 550. The shift register 510 determines the data latch timing according to a clock signal CLK. The data register/latch 520 latches digital data according to the timing determined by the shift register 510, and outputs it to the level shift circuit group in response to a control signal. Then the level-converted digital data is sent to the digital-to-analog converter 540. The digital-to-analog converter 540 receives a reference voltage from the reference voltage generator circuit 550, and outputs a grayscale voltage signal according to the control signal and the digital data.

Figure 12:
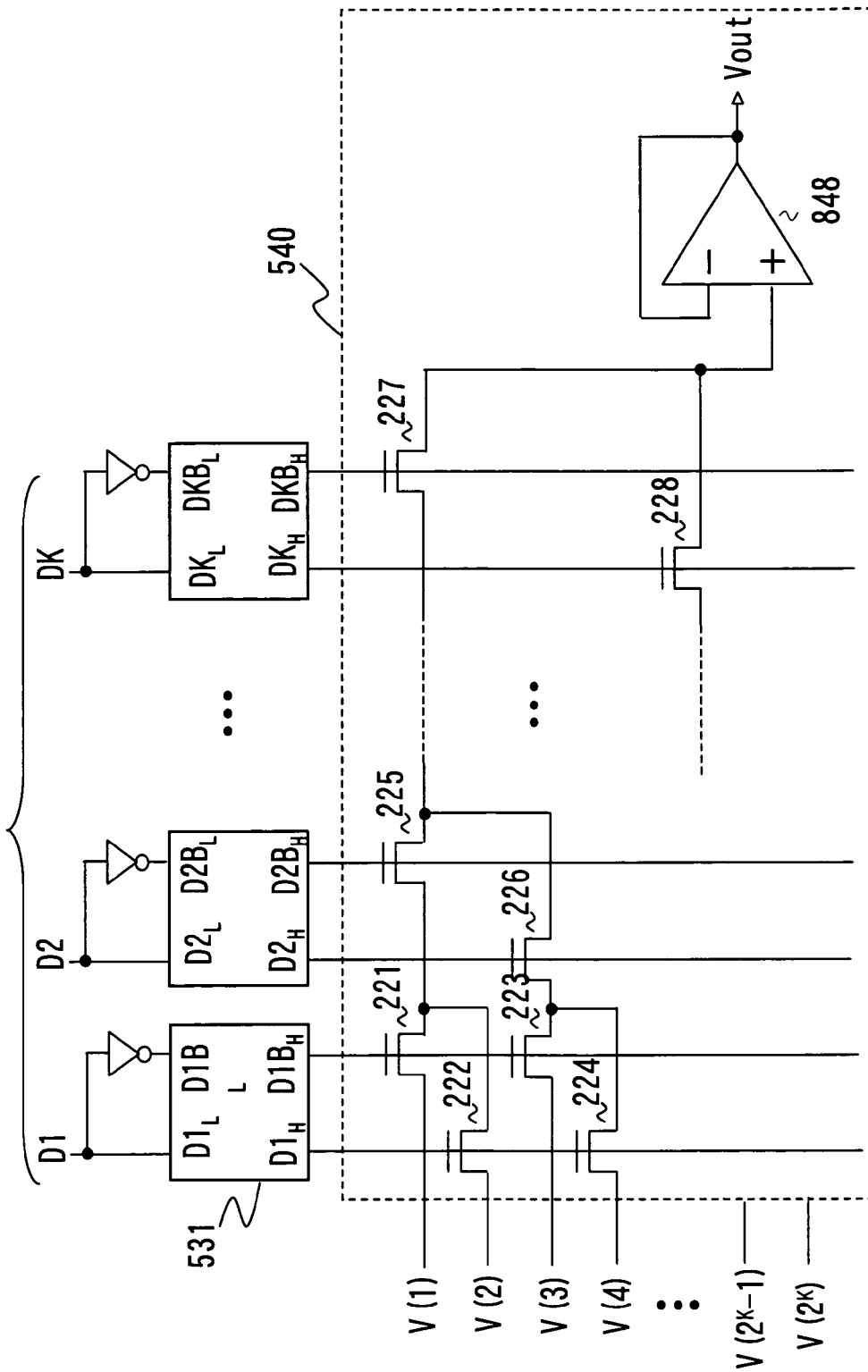
FIG. 12 is a drawing illustrating the configuration between a level shift circuit and a parallel DAC.

FIG. 12 shows an example constituting one output of the level shift circuit group 530 and the digital-to-analog converter 540 of the data driver in FIG. 11. In FIG. 12, K-bit picture digital data D1 to DK is supplied in parallel, one voltage is decoded from $2^K$ grayscale voltages, and it is amplified by an amplifier and outputted. In this configuration, the number of the level shift circuits required for one output is K. Between the grayscale voltages $V(1), V(2), \ldots V(2^K)$ and a non-inverting input terminal of a differential amplifier 848 operating in a voltage follower mode, switches (pass transistors) 221, 222, ... 228 on/off controlled according to the output signal from the level shift circuit 531 are provided. For instance, when (D1, D2, ... DK)=(0, 0, ... 0), the pass transistors 221, 225, ... 227 are turned on, and the grayscale voltage V(1) is fed to the voltage follower 848. When (D1, D2, ... DK)=(1, 0, ... 0), the pass transistors 222, 225, ... 227 are turned on, and the grayscale voltage V(2) is fed to the voltage follower 848.

Figure 13:
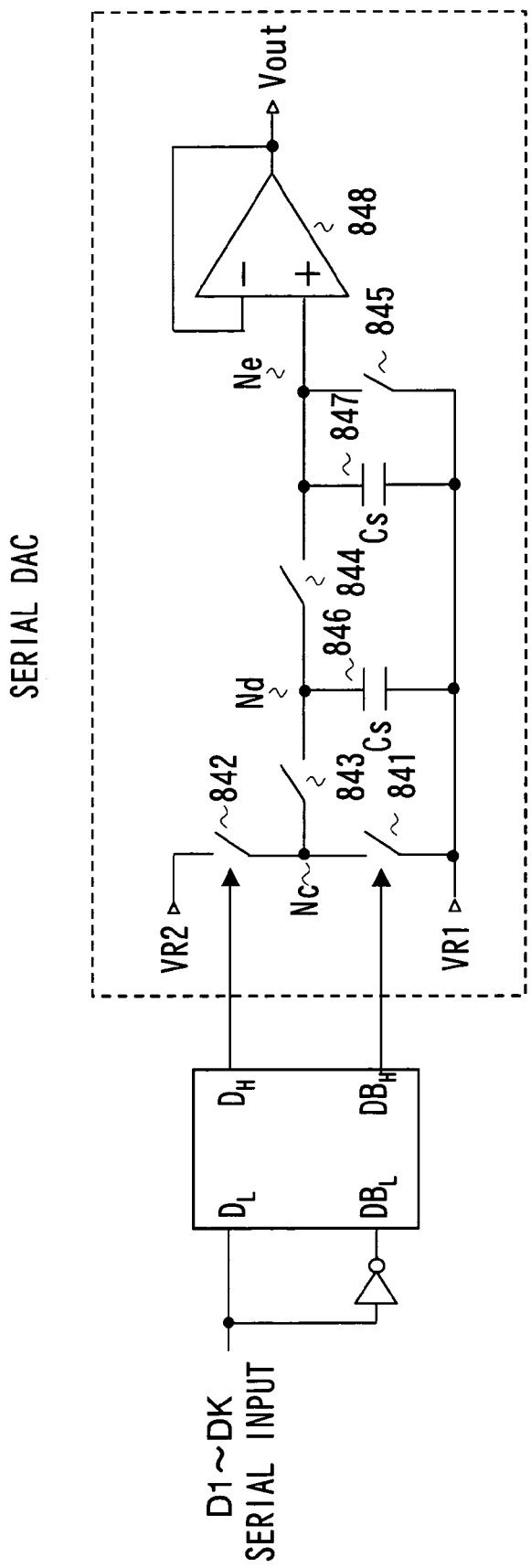
FIG. 13 is a drawing illustrating the configuration between a level shift circuit and a serial DAC.

FIG. 13 shows another example constituting one output of the level shift circuit group 530 and the digital-to-analog converter 540 of the data driver in FIG. 11. In the example shown in FIG. 13, K-bit picture digital data D1 to DK is supplied in time series and level-shifted. The grayscale voltage is generated by redistributing the electric charges of a plurality of capacitors, amplified and outputted by an amplifier. In this configuration, one level shift circuit is required for one output, however, high-speed operation is necessary since it needs to level shift the K-bit data within a period when the grayscale voltage is being outputted.

A method in which a grayscale voltage is obtained by time-serially sampling a reference voltage according to bit data is known. FIG. 13 shows a configuration example of such a serial DAC (refer to Patent Document 3—Japanese Patent Kokai Publication No. JP-A-59-154820). The entire disclosure thereof is incorporated herein by reference thereto.

Referring to FIG. 13, this serial DAC comprises two capacitors 846 and 847 having one ends connected to a terminal supplying a reference voltage VR1 and the other ends connected to terminals Nd and Ne respectively, switches 841 and 842, connected to a terminal Nc, that select between the terminal supplying reference voltage VR1 and a terminal supplying a reference voltage VR2, switches 843 and 844 respectively connected between the terminals Nc and Nd, and between the terminals Nd and Ne, a switch 845 connected between the terminal Ne and the terminal supplying the reference voltage VR1, and a voltage follower circuit 848 having the terminal Ne as its input end. The capacitance value of the capacitor 846 and 847 is Cs.

First, the switch 845 is temporarily switched on (closed), resetting the potential difference between the both terminals of the capacitor 847 to 0.

Next, the switch 843 is switched on, one of the reference voltages VR1 or VR2 is sampled at the terminal Nd by the switches 841 and 842 according to the least significant bit data D1, and then the switch 843 is switched off. The switch 844 is switched on, and electric charges are redistributed between the capacitors 846 and 847. The switch 844 is switched off, and the charges are held by the capacitor 847. Then, according to the next bit data D2, one of the reference voltages is sampled by the switches 841 and 842, and after the switch 844 causes the redistribution of the charges between the capacitors 846 and 847, the charges are held. The sampling and the holding are similarly repeated from the least significant bit data to the most significant bit data. In the case of K-bit data, a cycle of the sampling and the holding is repeated K times, and a voltage $V_K$ of the terminal Ne is given by the following equation:

$$V_K = (2^{-1} \cdot D_K + 2^{-2} \cdot D_{K-1} + \ldots + 2^{-K} \cdot D_1) \cdot (VR2 - VR1)$$

where $D_K, D_{K-}, \ldots, D_1$ is 0 or 1.

The voltage $V_K$ is amplified and outputted by the voltage follower circuit 848.

As described above, the DAC shown in FIG. 13 can output the voltage levels that equally divide the difference between the reference voltages VR1 and VR2 into $2^K$ according to K-bit data.

Since the structure of the DAC in FIG. 13 does not depend on the number of data bits, the circuit scale of a data driver for high bit data can be reduced greatly. However, the output voltage of the DAC in FIG. 13 is a linear output where the difference of each voltage level is equal, and as it is, it cannot output a grayscale voltage corresponding to the gamma characteristics of the liquid crystal.

Meanwhile, a method in which a DAC capable of outputting linear outputs several times as many as the number of grayscale voltages required is constituted and grayscale voltages corresponding to the gamma characteristics of the liquid crystal are selected from the large number of the linear output levels has recently been proposed in Non-Patent Document 2. The entire disclosure thereof is herein incorporated by reference thereto.

In this method, the number of bits increases a few more than the number of bits corresponding to the number of grayscale voltages actually outputted. Therefore, the DAC in FIG. 13, whose configuration does not depend on the number of bits, is suitable for the method.

Note that FIG. 13 corresponds to FIG. 5-42 of Non-Patent Document 1, and FIGS. 1 and 2 of Patent Document 3, and its principle is introduced in each document, the entire disclosures thereof being incorporated herein by reference thereto.

Figure 14:
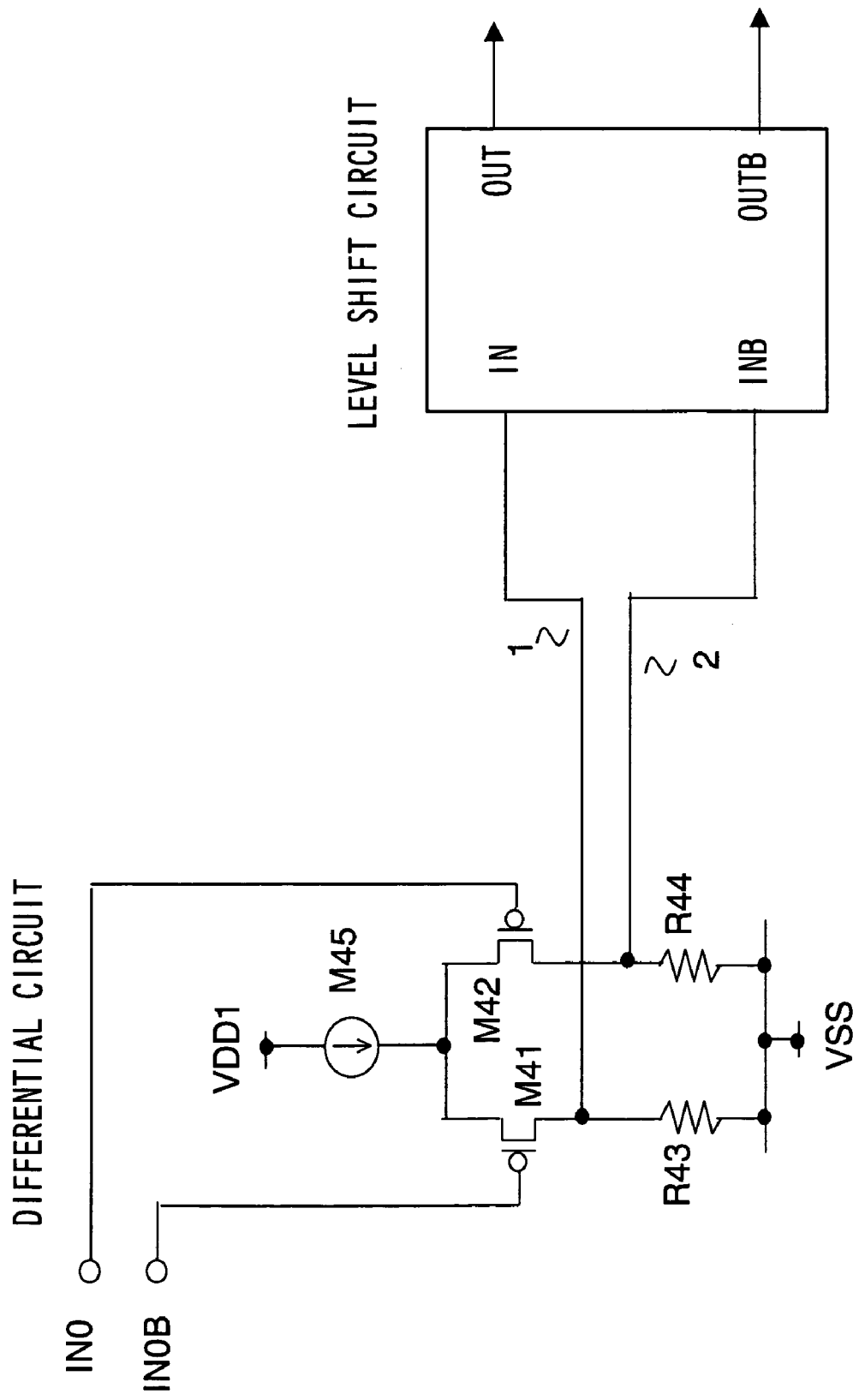
FIG. 14 is a drawing illustrating the configuration of a receiver circuit of an eleventh example of the present invention.
Figure 15:
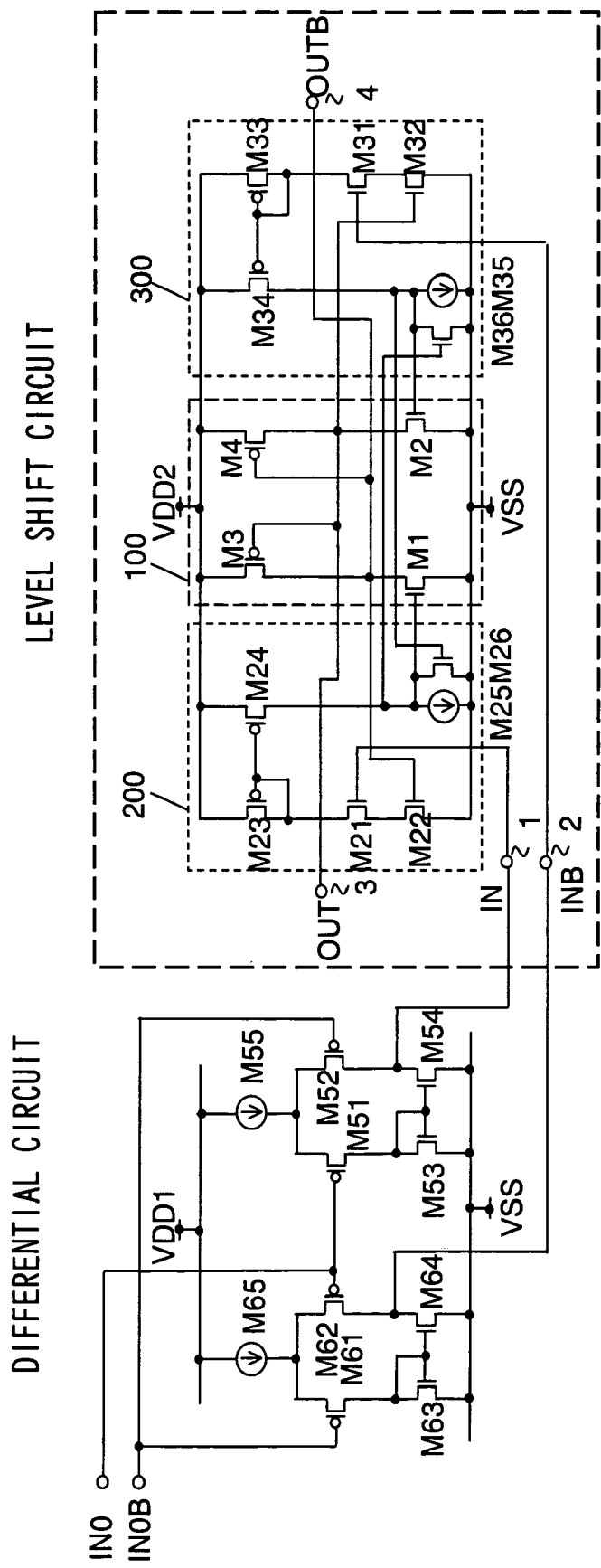
FIG. 15 is a drawing showing an application example of the receiver circuit of the eleventh example of the present invention.

FIGS. 14 and 15 show a receiver circuit of an interface that sends/receives data constituted by using the level shift circuits of the first to the seventh examples described with reference to FIGS. 1 to 7. For instance, it can be utilized as a picture data receiver circuit, provided in the data driver 980, of an interface that sends/receives picture data between the display controller 950 and the data driver 980 of the LCD device shown in FIG. 21.

The receiver circuit is used to convert small-amplitude differential signals (for instance Vref±0.2V) such as LVDS into logic signals (for instance a low potential power supply voltage VSS=0V, a high potential power supply voltage VDD2=2.5V to 3.3V) for the driver at high speed.

In the level shift circuits of the first to the seventh examples, when the input signals IN and INB are at a HIGH level and at a LOW level, it is necessary for the transistors M21 and M31 in the first and the second current control circuits 200 and 300 to be turn on and off respectively.

When the level shift circuit of the present invention directly receives differential signals having very small amplitudes as the input signals IN and INB, in order for the level shift circuit to operate normally, the reference voltage Vref of the differential signals has to be near the threshold voltage of the transistors M21 and M31. Therefore, if the level shift circuit is used as a receiver circuit without any modification, its application will be limited. In the present example, the reference voltage of the differential signals does not depend on the aforementioned threshold voltage because a differential circuit is provided in a stage preceding to the level shift circuits described in the previous examples. Therefore, the level shift operation can be performed while receiving various differential signals IN0 and IN0B. Further, since the level shift circuit of the present invention is capable of a high speed operation, it can be applied to a receiver circuit of a high speed serial interface.

FIG. 14 shows an example of the differential circuit provided in a stage preceding to the level shift circuit, and a load element pair connected to an output pair of a differential pair (M41 and M42) is formed with resistance elements R43 and R44. The differential pair receives the differential signals IN0 and IN0B as an input, and the outputs of the differential pair are fed to the level shift circuit as the signals IN and INB. The load element pair can be replaced with a current mirror structure (or transistor pair) constituted by transistors.

FIG. 15 is a figure showing an application example of the configuration shown in FIG. 14. Each differential circuit in FIG. 15 is driven by a current source, and they comprises two differential pairs (M51 and M52) and (M61 and M62) receiving the differential signals IN0 and IN0B at the input pairs. Load element pairs (M53 and M54) and (M63 and M64) are respectively connected to the differential pair in a current mirror configuration, and output ends of the current mirrors are respectively connected to the input terminals 1 and 2 of the level shift circuit. The differential signals IN0 and IN0B are fed to the non-inverting input ends of one of the aforementioned two differential pairs and to the inverting input ends of the other. In this differential circuit configuration, even when the reference voltages of the differential signals IN0 and IN0B change, the reference voltage Vref of the output signals (IN and INB) of the differential circuits is near the threshold voltage of each transistor (M53 and M54) and (M63 and M64) in the current mirrors. Therefore, the size of the transistors (M21 and M31) in the level shift circuit is the same as that of the transistors in the current mirrors in the differential circuits.

As described above, even when the reference voltages of the differential signals (IN0 and IN0B) supplied to the differential circuits have different levels, the outputs (the differential signals IN and INB) of the differential circuits are at a potential higher than the aforementioned threshold voltage when they are at a HIGH level, and at a potential lower than the threshold voltage when they are at a LOW level. Therefore the normal operation of the level shift circuit can be achieved.

In the examples described above, the transistors used are not limited to transistors formed on a single-crystal silicon substrate, but they may be transistors formed on an insulating substrate. Further, the current control circuits 200 and 300 of the level shift circuits shown in FIGS. 1-7 have symmetric formulations each other, however, any one of the current control circuits 200 shown in FIGS. 1-7 may be replaced with any other one of such current control circuits 200 shown in FIGS. 1-7. In the same token, any one of the current control circuits 300 in those figures may be replaced with any other one thereof shown in those figures.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A level shift circuit comprising:

first and second terminals that respectively receive an input signal and a complementary signal of said input signal having a first amplitude;

third and fourth terminals that respectively output an output signal and a complementary signal of said output signal having a second amplitude, which is larger than said first amplitude;

an output circuit comprising first and second transistors of a first polarity, respectively connected between a first power supply and said fourth terminal and between said first power supply and said third terminal, and third and fourth transistors of a second polarity, respectively connected between a second power supply and said fourth terminal and between said second power supply and said third terminal, having control ends connected to said third and fourth terminals, respectively;

a first current control circuit that receives said input signal and the complementary signal of said output signal at said first terminal and said fourth terminal, respectively, that outputs first voltage signal to the control end of said first transistor according to values of said input signal and the complementary signal of said output signal, and that drive-controls a current flowing through said first transistor; and a second current control circuit that receives the complementary signal of said input signal and said output signal at said second terminal and said third terminal, respectively, that outputs second voltage signal to the control end of said second transistor according to values of the complementary signal of said input signal and said output signal, and that drive-controls a current flowing through said second transistor.

2. The level shift circuit as defined in claim 1 wherein;

said input signal and its complementary signal are not supplied from said first terminal and said second terminal to control ends of said first and second transistors in said output circuit;

a value of a differential potential between potentials of the control end of said first transistor and said first power supply is settable to a value not less than said first amplitude (but not more than said second amplitude) when said first transistor is turned on by activating said first current control circuit; and a value of a differential potential between potentials of the control end of said second transistor and said first power supply is settable to a value not less than said first amplitude (but not more than said second amplitude) when said second transistor is turned on by activating said second current control circuit.

3. The level shift circuit as defined in claim 1 wherein;

said first current control circuit is activated when said input signal and the complementary signal of said output signal from said first and fourth terminals, respectively, are both at a second logical value, turns on said first transistor, and is deactivated and turns off said first transistor after said turned-on first transistor changes the complementary signal of said output signal from the second logical value to a first logical value of potential; and said second current control circuit is activated when the complementary signal of said input signal and said output signal from said second and third terminals are both at the second logical value, turns on said second transistor, and is deactivated and turns off said second transistor after said turned-on second transistor changes said output signal from the second logical value to the first logical value of potential.

4. The level shift circuit as defined in claim 1 wherein;
said first current control circuit comprises:
a first current generator circuit, having one end connected to said first power supply and comprising two transistors, connected in series, that respectively receive said input signal and the complementary signal of said output signal at control ends; and
a first current-voltage conversion circuit that converts an output current of said first current generator circuit into said first voltage signal, and outputs it to the control end of said first transistor; and
said second current control circuit comprises:
a second current generator circuit, having one end connected to said first power supply and comprising two transistors, connected in series, that respectively receive the complementary signal of said input signal and said output signal at control ends; and
a second current-voltage conversion circuit that converts an output current of said second current generator circuit into said second voltage signal, and outputs it to the control end of said second transistor.

5. The level shift circuit as defined in claim 1 wherein;
said first current control circuit comprises:
a first current generator circuit comprising fifth and sixth transistors of a first polarity, connected in series, having one end connected to said first power supply and receiving said input signal and the complementary signal of said output signal at a respective control end;
a first resistance connected between an output end of said first current generator circuit and said second power supply; and
a seventh transistor of a second polarity, having a control end connected to the output end of said first current generator circuit, and a second resistance connected in series across said first and second power supplies;
a connection node between said seventh transistor and said second resistance being connected to the control end of said first transistor; and
said second current control circuit comprises:
a second current generator circuit comprising eighth and ninth transistors of the first polarity, connected in series, having one end connected to said first power supply and receiving the complementary signal of said input signal and said output signal at a respective control end;
a third resistance connected between an output end of said second current generator circuit and said second power supply; and
a tenth transistor of the second polarity, having a control end connected to the output end of said second current generator circuit, and a fourth resistance connected in series across said first and second power supplies;
a connection node between said tenth transistor and said fourth resistance being connected to the control end of said second transistor.

6. The level shift circuit as defined in claim 5 wherein at least one of said first to fourth resistances is constituted by a diode-connected transistor or a current source.

7. The level shift circuit as defined in claim 1 wherein;
said first current control circuit comprises:
a first current generator circuit comprising fifth and sixth transistors of a first polarity, connected in series, having one end connected to said first power supply and receiving said input signal and the complementary signal of said output signal at a respective control end;
a diode-connected eleventh transistor of a second polarity connected between an output end of said first current generator circuit and said second power supply; and
a seventh transistor of the second polarity, having a control end connected to a control end of said eleventh transistor, and a diode-connected twelfth transistor of the first polarity connected in series across said first and the second power supplies;
a control end of said twelfth transistor being connected to the control end of said first transistor; and
said second current control circuit comprises:
a second current generator circuit comprising eighth and ninth transistors of the first polarity, connected in series, having one end connected to said first power supply and receiving the complementary signal of said input signal and said output signal at a respective control end;
a diode-connected thirteenth transistor of the second polarity connected between an output end of said second current generator circuit and said second power supply; and
a tenth transistor of the second polarity, having a control end connected to a control end of said thirteenth transistor, and a diode-connected fourteenth transistor of the first polarity connected in series across said first and the second power supplies;
a control end of said fourteenth transistor being connected to the control end of said second transistor.

8. The level shift circuit as defined in claim 1 wherein;
said first current control circuit comprises:
a first current generator circuit comprising fifth and sixth transistors of a first polarity, connected in series, having one end connected to said first power supply and receiving said input signal and the complementary signal of said output signal at a respective control end;
a diode-connected eleventh transistor of a second polarity connected between an output end of said first current generator circuit and said second power supply;
a seventh transistor of the second polarity, having a control end connected to a control end of said eleventh transistor, and a twelfth transistor of the first polarity connected in series across said first and the second power supplies;
a connection node between said seventh transistor and said twelfth transistor being connected to the control end of said first transistor;
a bias voltage being supplied to a control end of said twelfth transistor from a bias circuit; and
said second current control circuit comprises:
a second current generator circuit comprising eighth and ninth transistors of the first polarity, connected in series, having one end connected to said first power supply and receiving the complementary signal of said input signal and said output signal at a respective control end;
a diode-connected thirteenth transistor of the second polarity connected between an output end of said second current generator circuit and said second power supply; and
a tenth transistor of the second polarity, having a control end connected to a control end of said thirteenth transistor, and a fourteenth transistor of the first polarity connected in series across said first and the second power supplies;
a connection node between said tenth transistor and said fourteenth transistor being connected to the control end of said second transistor;
a bias voltage being supplied to a control end of said fourteenth transistor from said bias circuit.

9. The level shift circuit as defined in claim 1 wherein;
said first current control circuit comprises:
a first current generator circuit comprising fifth and sixth transistors of a first polarity, connected in series, having one end connected to said first power supply and receiving said input signal and the complementary signal of said output signal at a respective control end;
a diode-connected eleventh transistor of a second polarity connected between an output end of said first current generator circuit and said second power supply; and
a seventh transistor of the second polarity, having a control end connected to a control end of said eleventh transistor, and a twelfth transistor of the first polarity connected in series across said first and the second power supplies;
a connection node between said seventh transistor and said twelfth transistor being connected to the control end of said first transistor;
a control end of said twelfth transistor being connected to said first terminal; and
said second current control circuit comprises:
a second current generator circuit comprising eighth and ninth transistors of the first polarity, connected in series, having one end connected to said first power supply and receiving the complementary signal of said input signal and said output signal at a respective control end;
a diode-connected thirteenth transistor of the second polarity connected between an output end of said second current generator circuit and said second power supply; and
a tenth transistor of the second polarity, having a control end connected to a control end of said thirteenth transistor, and a fourteenth transistor of the first polarity connected in series between said first and the second power supplies;
a connection node between said tenth transistor and said fourteenth transistor being connected to the control end of said second transistor;
a control end of said fourteenth transistor being connected to said second terminal;
wherein said first current control circuit further comprises a fifteenth transistor of the first polarity, connected in parallel with said twelfth transistor, having a control end connected to said second terminal; and
said second current control circuit further comprises a sixteenth transistor of the first polarity, connected in parallel with said fourteenth transistor, having a control end connected to said first terminal.

10. The level shift circuit as defined in claim 1 wherein;
said first current control circuit comprises:
a first current generator circuit comprising fifth and sixth transistors of a first polarity, connected in series, having one end connected to said first power supply and receiving said input signal and the complementary signal of said output signal at a respective control end;
a diode-connected eleventh transistor of a second polarity connected between an output end of said first current generator circuit and said second power supply; and
a seventh transistor of the second polarity, having a control end connected to a control end of said eleventh transistor, and a first current source connected in series across said first and the second power supplies;
a connection node between said seventh transistor and said first current source being connected to the control end of said first transistor; and
said second current control circuit comprises:
a second current generator circuit comprising eighth and ninth transistors of the first polarity, connected in series, having one end connected to said first power supply and receiving the complementary signal of said input signal and said output signal at a respective control end;
a diode-connected twelfth transistor of the second polarity connected between an output end of said second current generator circuit and said second power supply; and
a tenth transistor of the second polarity, having a control end connected to a control end of said twelfth transistor, and a second current source connected in series across said first and the second power supplies;
a connection node between said tenth transistor and said second current source being connected to the control end of said second transistor;
wherein said first current control circuit further comprises a thirteenth transistor of the first polarity in parallel with said first current source;
a control end of said thirteenth transistor being connected to the control end of said second transistor;
said second current control circuit further comprises a fourteenth transistor of the first polarity in parallel with said second current source; and
a control end of said fourteenth transistor is connected to the control end of said first transistor.

11. The level shift circuit as defined in claim 1 wherein said output circuit comprises a transistor of a first polarity connected in parallel with said first transistor between said fourth terminal and said first power supply and on/off controlled according to said input signal, and a transistor of a first polarity connected in parallel with said second transistor between said third terminal and said first power supply and on/off controlled according to the complementary signal of said input signal.

12. The level shift circuit as defined in claim 4 further comprising a transistor of a second polarity, connected between said second power supply and said third terminal, having a control end connected to the output end of said first current generator circuit, and a transistor of a second polarity, connected between said second power supply and said fourth terminal, having a control end connected to the output end of said second current generator circuit.

13. The level shift circuit as defined in claim 1 wherein the lowest potential determining each end of said first amplitude and said second amplitude is equal to each other, and the highest potential determining the other end of said second amplitude is higher than the highest potential of said first amplitude.

14. The level shift circuit as defined in claim 1 wherein the highest potential determining each end of said first amplitude and said second amplitude is equal to each other, and the lowest potential determining the other end of said second amplitude is lower than the lowest potential of said first amplitude.

15. A scanning driver outputting a scanning signal according to a timing signal that it receives,
said scanning driver comprising said level shift circuit as defined in claim 1.

16. A data driver comprising said level shift circuit as defined in claim 1, said data driver driving a data line according to a digital data signal that it receives.

17. The data driver as defined in claim 16 wherein said data driver receives an output from said level shift circuit and comprises a digital-to-analog converter that outputs a grayscale voltage.

18. A receiver circuit comprising:
a differential circuit that differentially receives and outputs digital data signals; and a level shift circuit that differentially receives outputs of said differential circuit at first and second terminals and that outputs level-shifted signal and its complementary signal from third and fourth terminals; wherein
said level shift circuit is the level shift circuit as defined in claim 1.

19. A receiver circuit comprising said level shift circuit as defined in claim 7.

20. A receiver circuit comprising said level shift circuit as defined in claim 8.

* * * * *